United States Patent
Kim

(10) Patent No.: US 9,966,262 B2
(45) Date of Patent: May 8, 2018

(54) METHODS OF FABRICATING A SEMICONDUCTOR DEVICE

(71) Applicant: Samsung Electronics Co., Ltd., Suwon-si, Gyeonggi-do (KR)

(72) Inventor: Jaewoo Kim, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/246,092

(22) Filed: Aug. 24, 2016

(65) Prior Publication Data

US 2017/0069494 A1    Mar. 9, 2017

(30) Foreign Application Priority Data

Sep. 4, 2015   (KR) .................. 10-2015-0125447

(51) Int. Cl.
*H01L 21/033* (2006.01)
*H01L 21/311* (2006.01)
*H01L 21/768* (2006.01)

(52) U.S. Cl.
CPC .... *H01L 21/0337* (2013.01); *H01L 21/31144* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 8,216,947 B2 | 7/2012 | Lee et al. | |
| 8,263,322 B2 | 9/2012 | Ando | |
| 8,303,831 B2 | 11/2012 | Kim | |
| 8,383,479 B2 | 2/2013 | Purayath et al. | |
| 8,445,184 B2 | 5/2013 | Matsuda | |
| 8,546,258 B2 | 10/2013 | Kim et al. | |
| 8,846,541 B2 * | 9/2014 | Min ................. | H01L 21/0337 438/671 |
| 8,946,022 B2 | 2/2015 | Purayath et al. | |
| 8,954,913 B1 | 2/2015 | Yuan et al. | |
| 8,963,332 B2 | 2/2015 | Kim et al. | |
| 9,093,378 B2 | 7/2015 | Kim et al. | |
| 9,117,654 B2 | 8/2015 | Lee et al. | |
| 2005/0112821 A1 * | 5/2005 | Kim ................ | H01L 21/28273 438/258 |
| 2007/0069316 A1 | 3/2007 | Lee | |

(Continued)

FOREIGN PATENT DOCUMENTS

| | | |
|---|---|---|
| JP | 2010-103538 | 5/2010 |
| JP | 2013500587 | 1/2013 |

(Continued)

*Primary Examiner* — Allan Olsen
(74) *Attorney, Agent, or Firm* — Myers Bigel, P.A.

(57) ABSTRACT

Methods of fabricating a semiconductor device are provided. The methods may include forming a hard mask film on a lower film and forming first spacers on the hard mask film. The first spacers may define an exposure region of the hard mask film, and the exposure region may include a patterning portion and a non-patterning portion. The methods may also include forming a mold film on the first spacers and forming a blocking pattern in the mold film. The blocking pattern may vertically overlap the non-patterning portion. The methods may further include exposing the first spacers by removing the mold film after forming the blocking pattern.

20 Claims, 42 Drawing Sheets

(56) References Cited

U.S. PATENT DOCUMENTS

| | | | |
|---|---|---|---|
| 2007/0210449 A1* | 9/2007 | Caspary | H01L 27/105 257/734 |
| 2007/0249117 A1* | 10/2007 | Kang | C08F 220/06 438/241 |
| 2009/0093121 A1* | 4/2009 | Moon | H01L 21/0337 438/696 |
| 2009/0311861 A1* | 12/2009 | Park | H01L 21/0337 438/689 |
| 2010/0173492 A1* | 7/2010 | Kim | H01L 21/0337 438/689 |
| 2012/0058639 A1* | 3/2012 | Sim | H01L 21/7682 438/666 |
| 2012/0126421 A1* | 5/2012 | Lee | H01L 21/76816 257/774 |
| 2012/0214311 A1 | 8/2012 | Burkhardt et al. | |
| 2015/0095857 A1 | 4/2015 | Hsu et al. | |
| 2015/0126013 A1* | 5/2015 | Hwang | H01L 27/10888 438/381 |
| 2016/0005615 A1* | 1/2016 | Lee | H01L 21/76816 438/666 |
| 2017/0103891 A1* | 4/2017 | Lee | H01L 21/0337 |

FOREIGN PATENT DOCUMENTS

| | | |
|---|---|---|
| KR | 1020070035301 | 3/2007 |
| KR | 1020120134216 | 12/2012 |
| WO | WO 2011/011525 | 1/2011 |

* cited by examiner

METHODS OF FABRICATING A SEMICONDUCTOR DEVICE

CROSS-REFERENCE TO RELATED APPLICATION

This application claims priority under 35 U.S.C. § 119 to Korean Patent Application No. 10-2015-0125447 filed on Sep. 4, 2015 in the Korean Intellectual Property Office, the disclosure of which is hereby incorporated by reference in its entirety.

BACKGROUND

The present disclosure generally relates to the field of electronics and, more particularly, to methods of fabricating a semiconductor device.

The recent dramatic increase in the distribution of information media has led into remarkable advancement in the functionalities of semiconductor devices. To ensure higher competitiveness, new semiconductor products may need to meet demands for lower cost and higher quality by way of higher integration. The semiconductor scale-down may continue to achieve higher integration.

As the semiconductor integration increases, design rules for the components of the semiconductor device may decrease. In fabricating a micro pattern semiconductor device to meet the tendency toward higher integrated semiconductor device, micro patterns having widths beyond resolution limit of photography devices may be required.

Further, technology that can form micro patterns using simple processes utilizing a reduced number of photolithography processes and mask layers may be necessary.

SUMMARY

A method of fabricating a semiconductor device may include forming a hard mask film on a lower film and forming first spacers on the hard mask film. The hard mask film may include an exposure region exposed by the first spacers and the exposure region may include a patterning portion and a non-patterning portion. The method may also include forming a mold film on the first spacers and forming a blocking pattern in the mold film. The blocking pattern may vertically overlap the non-patterning portion of the hard mask film. The method may further include exposing the first spacers by removing the mold film after forming the blocking pattern.

In various embodiments, forming the blocking pattern may include forming a hole in the mold film. The hole may vertically overlap the non-patterning portion of the hard mask film. Forming the blocking pattern may also include forming a blocking film filling the hole and extending on an upper surface of the mold film and removing a portion of the blocking film extending on the upper surface of the mold film.

According to various embodiments, the method may also include forming a hard mask pattern on the lower film by etching the patterning portion of the hard mask film using the blocking pattern and the first spacers as an etching mask.

According to various embodiments, the method may also include forming a trench in the lower film by etching the lower film using the hard mask pattern as an etching mask and forming a conductive pattern in the lower film by filling the trench with a conductive material.

In various embodiments, the mold film may include a lower mold film and an upper mold film sequentially stacked on the hard mask film, and the blocking pattern may be formed in the upper mold film.

In various embodiments, the method may further include removing the upper mold film after forming the blocking pattern and forming a lower blocking pattern by patterning the lower mold film using the blocking pattern as a mask.

According to various embodiments, forming the lower blocking pattern may include exposing the first spacers.

According to various embodiments, the method may further include forming a hard mask pattern on the lower film by etching the patterning portion of the hard mask film using the lower blocking pattern and the first spacers as an etching mask.

In various embodiments, the method may also include forming a photoresist pattern on the mold film. The photoresist pattern may include an opening vertically overlapping the non-patterning portion.

In various embodiments, forming the first spacers may include forming a first mask pattern on the hard mask film, and the first spacers may be formed on sidewalls of the first mask pattern.

According to various embodiments, the first spacers may include forming a mask film on the hard mask film, forming a mask pattern on the mask film, forming a spacer film along an upper surface of the mask film and an upper surface and a sidewall of the mask pattern, forming second spacers on the mask film by performing an anisotropic etch on the spacer film and etching the mask film using the second spacers as an etching mask.

A method of fabricating a semiconductor device may include forming a hard mask film on a lower film and forming spacers on the hard mask film. The spacers may define an exposure region of the hard mask film, and the exposure region may include a patterning portion, a first non-patterning portion and a second non-patterning portion that may have different widths. The method may also include forming a mold film on the spacers and forming a first blocking pattern in the mold film. The first blocking pattern may vertically overlap the first non-patterning portion. The method may further include forming a second blocking pattern vertically overlapping the second non-patterning portion and exposing the spacers by removing the mold film after forming the first blocking pattern.

According to various embodiments, the first blocking pattern and the second blocking pattern may be concurrently formed.

In various embodiments, the second blocking pattern may be formed in the mold film. Forming the first blocking pattern and the second blocking pattern may include forming a first hole and a second hole in the mold film. The first hole may vertically overlap the first non-patterning portion, and the second hole may vertically overlap the second non-patterning portion. Forming the first blocking pattern and the second blocking pattern may also include forming a blocking film filling the first hole and the second hole and extending on an upper surface of the mold film and removing a portion of the blocking film extending on the upper surface of the mold film.

In various embodiments, the method may also include forming a photoresist pattern on the mold film. The photoresist pattern may include a first opening vertically overlapping the first non-patterning portion and a second opening vertically overlapping the second non-patterning portion.

In various embodiments, the second blocking pattern may be formed after the first blocking pattern is formed.

According to various embodiments, the method may further include forming a first photoresist pattern on the mold film prior to forming the first blocking pattern. The first photoresist pattern may include a first opening vertically overlapping the first non-patterning portion. The method may also include forming a second photoresist pattern on the mold film after forming the first blocking pattern. The second photoresist pattern may include a second opening vertically overlapping the second non-patterning portion.

According to various embodiments, the second blocking pattern may be formed in the mold film. Forming the first blocking pattern may include forming a first hole in the mold film and forming a first blocking film filling the first hole and extending on an upper surface of the mold film. The first hole may vertically overlap the first non-patterning portion. Forming the second blocking pattern may include forming a second hole in the mold film, forming a second blocking film filling the second hole and extending on the upper surface of the mold film and the first blocking pattern and removing a portion of the second blocking film extending on the upper surface of the mold film. The second hole may vertically overlap the second non-patterning portion.

In various embodiments, forming the first blocking pattern may further include removing a portion of the first blocking film extending on the upper surface of the mold film prior to forming the second hole.

According to various embodiments, the method may also include forming a first photoresist pattern on the mold film prior to forming the first blocking pattern and forming a second photoresist pattern on the mold film after forming the first blocking pattern. The first photoresist pattern may include an opening vertically overlapping the first non-patterning portion, and the second photoresist pattern may vertically overlap the second non-patterning portion.

In various embodiments, a width of the first non-patterning portion may be smaller than a width of the second non-patterning portion.

In various embodiments, forming the first blocking pattern may include forming a hole in the mold film using the first photoresist pattern as a mask, forming a blocking film filling the hole and extending on an upper surface of the mold film and removing a portion of the blocking film extending on the upper surface of the mold film. Forming the second blocking pattern may include patterning the mold film using the second photoresist pattern.

In various embodiments, the first blocking pattern may include a material having an etch selectivity with respect to the mold film.

According to various embodiments, the method may further include forming a hard mask pattern on the lower film by etching the patterning portion of the hard mask film using the first and the second blocking patterns and the spacers as a mask.

In various embodiments, the method may further include forming a trench in the lower film using the hard mask pattern as a mask and forming a conductive pattern in the lower film by filling the trench with a conductive material.

A method of fabricating a semiconductor device may include forming a hard mask film on a lower film, forming a mask pattern on the hard mask film and forming spacers on sidewalls of the mask pattern. The spacers may define an exposure region of the hard mask film, and the exposure region may include a patterning portion and a non-patterning portion. The method may also include forming a first mold film including a flat upper surface on the hard mask film and forming a photoresist pattern on the first mold film. The photoresist pattern may include an opening vertically overlapping the non-patterning portion of the hard mask film. The method may further include forming a hole in the first mold film using the photoresist pattern as a mask, forming a first blocking pattern filling the hole in the first mold film, exposing the spacers by removing the first mold film after forming the first blocking pattern, forming a hard mask pattern on the lower film by etching the patterning portion of the hard mask film after exposing the spacers, forming a trench in the lower film using the hard mask pattern as a mask and forming a conductive pattern in the lower film by filling the trench with a conductive material.

In various embodiments, forming the hard mask pattern may include etching the hard mask film using the spacers and the first blocking pattern as a mask.

According to various embodiments, the method may further include forming a second mold film on the spacers between the first mold film and the hard mask film. Exposing the spacers may include, after removing the first mold film, forming a second blocking pattern by patterning the second mold film using the first blocking pattern as a mask.

In various embodiments, forming the hard mask pattern may include etching the hard mask film using the spacers and the second blocking pattern as an etching mask.

A method of fabricating a semiconductor device may include forming a mask pattern on a hard mask film and forming spacers along a sidewall of the mask pattern. The spacers may define an exposure region of the hard mask film, and the exposure region may include a patterning portion and a non-patterning portion. The method may also include removing the mask pattern and forming a mold film on the hard mask film after removing the mask pattern. The mold film may extend on the spacers. The method may further include forming a photoresist pattern on the mold film. The photoresist pattern may include an opening vertically overlapping the non-patterning portion of the hard mask film, and the photoresist pattern may vertically overlap the patterning portion of the hard mask film. The method may also include forming a hole in the mold film using the photoresist pattern, forming a blocking pattern filling the hole and forming a hard mask pattern by etching the hard mask film using the blocking pattern and the spacers as an etching mask.

In various embodiments, the method may further include removing the mold film vertically overlapping the patterning portion after forming the blocking pattern.

According to various embodiments, removing the mold film may include performing a selective etching process so that the blocking pattern remains.

According to various embodiments, removing the mold film may include exposing the spacers.

According to various embodiments, the mold film may include a lower mold film and an upper mold film, and the blocking pattern may be formed in the upper mold film.

In various embodiments, the method may further include removing the upper mold film by performing a selective etching process after forming the blocking pattern in the upper mold film and patterning the lower mold film using the blocking pattern after removing the upper mold film.

A method of fabricating a semiconductor device may include forming a mask film on a substrate, forming a plurality of preliminary masks on the mask film and forming a mold film on the plurality of preliminary masks. The mold film may include a first hole that extends between a first pair of the plurality of preliminary masks. The method may also include forming a blocking pattern in the first hole of the mold film, at least partially removing the mold film and etching the mask film using the plurality of preliminary masks and the blocking pattern as an etching mask after at least partially removing the mold film.

According to various embodiments, the plurality of preliminary masks may include a second pair of the plurality of preliminary masks. The mold film may include a second hole extending between the second pair of the plurality of preliminary masks. The blocking pattern may include a first blocking pattern in the first hole and a second blocking pattern in the second hole, and the second blocking pattern may have a width greater than a width of the first blocking pattern. Etching the mask film may include etching the mask film using the plurality of preliminary masks, the first blocking pattern and the second blocking pattern as an etching mask after at least partially removing the mold film.

In various embodiments, the first blocking pattern and the second blocking pattern may be formed concurrently.

According to various embodiments, the plurality of preliminary masks may include a second pair of the plurality of preliminary masks. At least partially removing the mold film may include forming a mask pattern on the mold film and etching the mold film using the mask pattern as an etching mask. The mask pattern may vertically overlap a portion of the mold film that extends between the second pair of the plurality of preliminary masks. Etching the mask film may include etching the mask film using the plurality of preliminary masks, the blocking pattern and the portion of the mold film that extends between the second pair of the plurality of preliminary masks as an etching mask after at least partially removing the mold film.

In various embodiments, the plurality of preliminary masks may include a second pair of the plurality of preliminary masks. At least partially removing the mold film may include exposing opposing sides of each of the second pair of the plurality of preliminary masks. Etching the mask film may include etching the mask film using the second pair of the plurality of preliminary masks as an etching mask after at least partially removing the mold film.

According to various embodiments, the mold film may have an etch selectivity with respect to both the plurality of preliminary masks and the blocking pattern.

BRIEF DESCRIPTION OF THE DRAWINGS

The above and other objects, features and advantages of the present disclosure will become more apparent to those of ordinary skill in the art by describing in detail example embodiments of the present inventive concept with reference to the accompanying drawings, in which.

DETAILED DESCRIPTION

Figure 1:
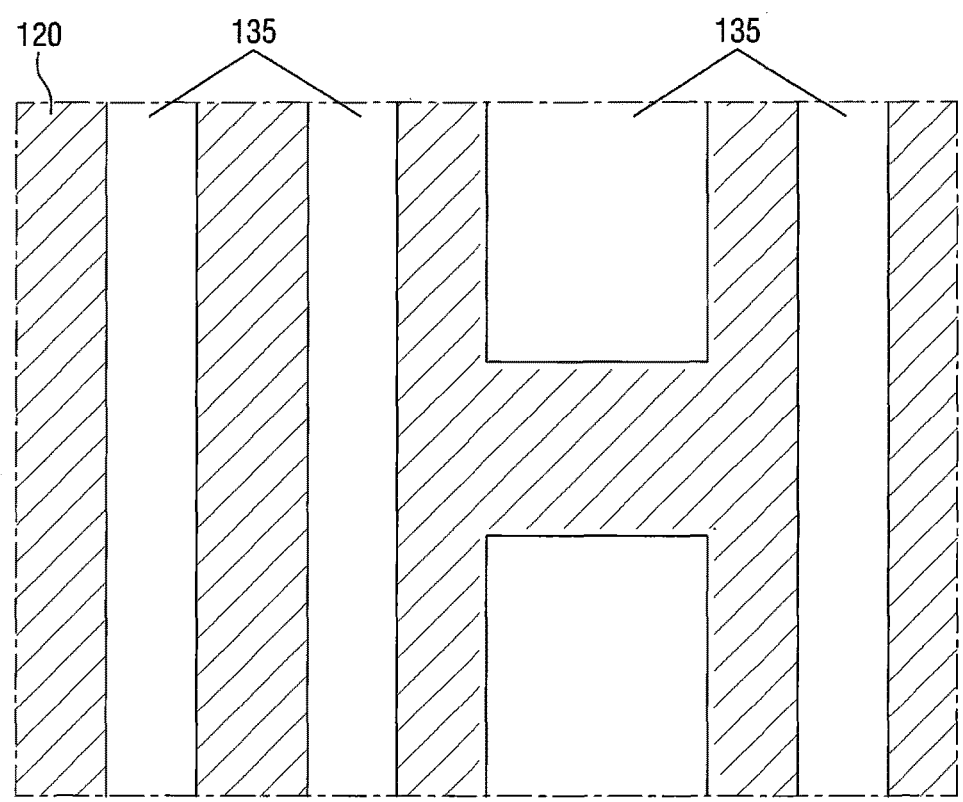
FIGS. 1 through 13 are views illustrating a method of fabricating a semiconductor device according to some example embodiments of the present inventive concept.

Advantages and features of the present inventive concept and methods of accomplishing the same may be understood more readily by reference to the following detailed description of example embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concept will only be defined by the appended claims. In the drawings, the thickness of layers and regions are exaggerated for clarity.

Example embodiments of the inventive concepts are described herein with reference to cross-sectional or perspective illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but may include deviations in shapes that result, for example, from manufacturing.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like reference numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Unless defined otherwise, all technical and scientific terms used herein have the same meaning as commonly understood by one of ordinary skill in the art to which this inventive concept belongs. It is noted that the use of any and all examples, or terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinbelow, a method of fabricating a semiconductor device according to some example embodiments of the inventive concept will be explained with reference to FIGS. 1 to 13.

FIGS. 1 to 13 are views illustrating a method of fabricating a semiconductor device according to some example embodiments of the inventive concept.

Figure 2A:
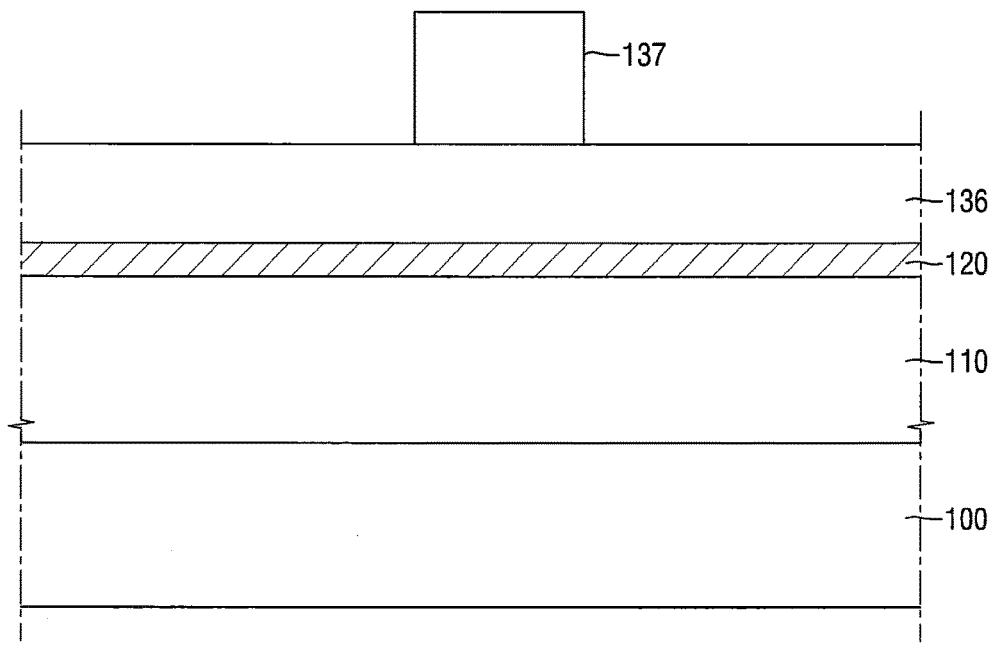
Figure 2B:
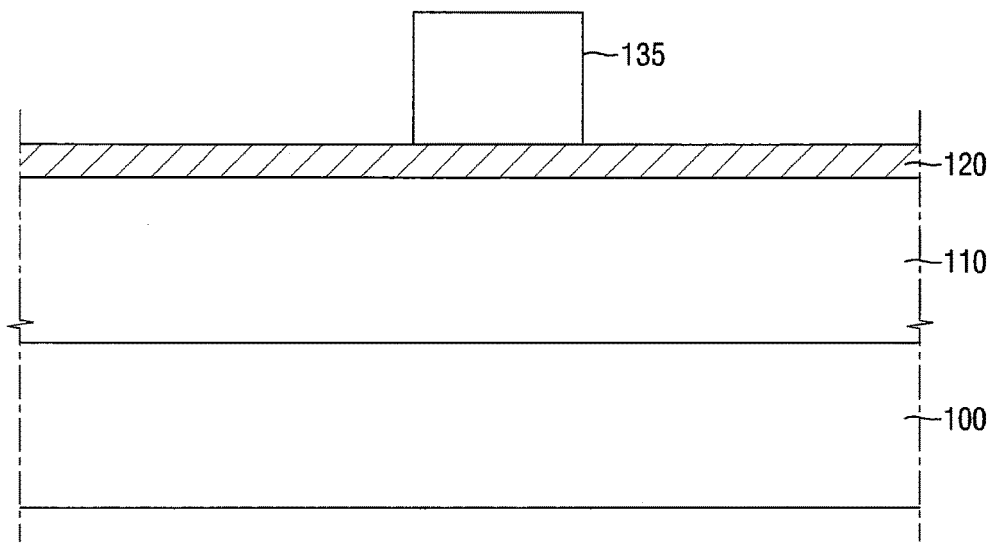

FIGS. 2A and 2B are views provided to explain a method of forming a first mask pattern of FIG. 1 according to some embodiments. FIGS. 3A to 3E are views provided to explain a method of forming the first mask pattern of FIG. 1 according to some embodiments. FIGS. 5B, 6B, 7B and 10B are cross sectional views taken along the line A-A of FIGS. 5A, 6A, 7A and 10A, respectively.

Figure 3A:
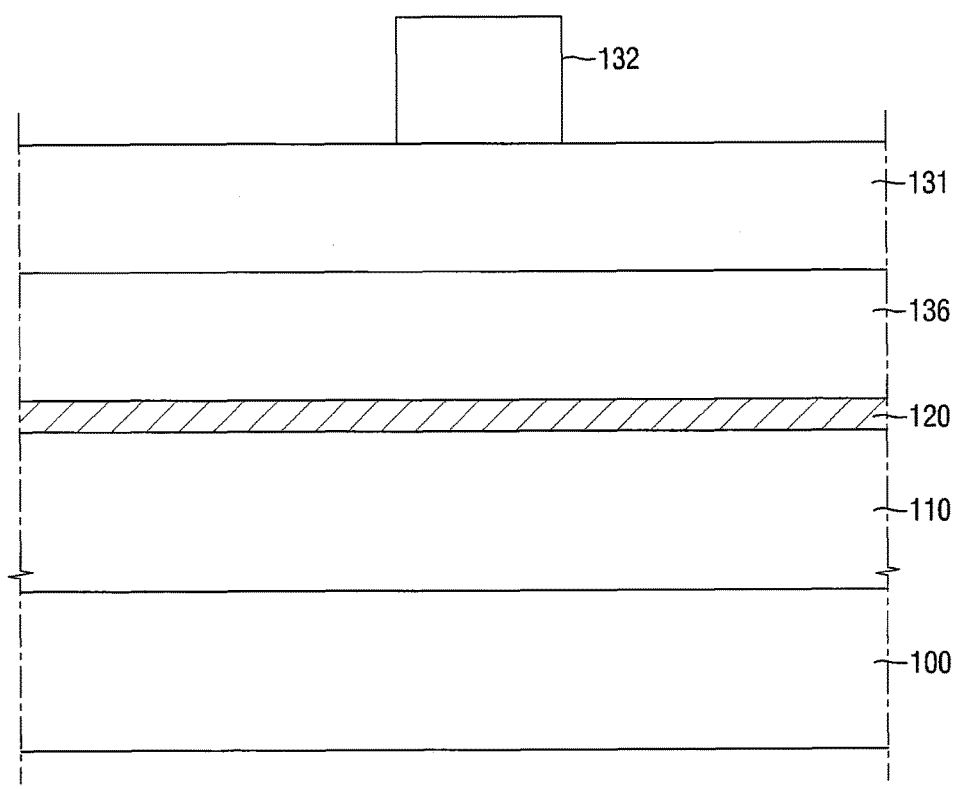
Figure 3B:
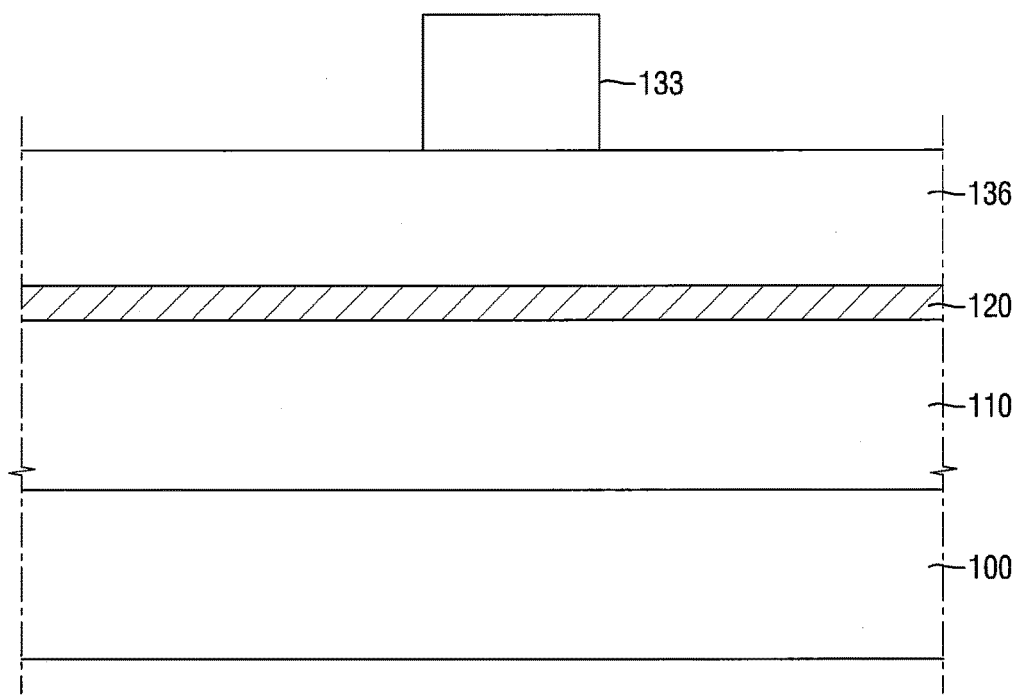
Figure 3C:
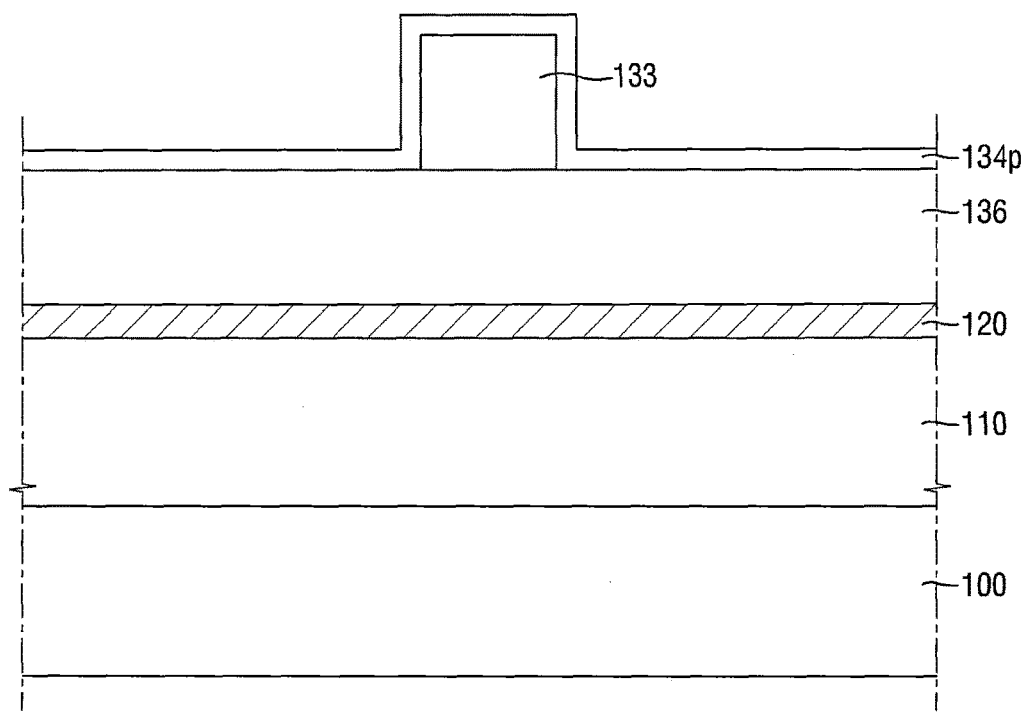
Figure 3D:
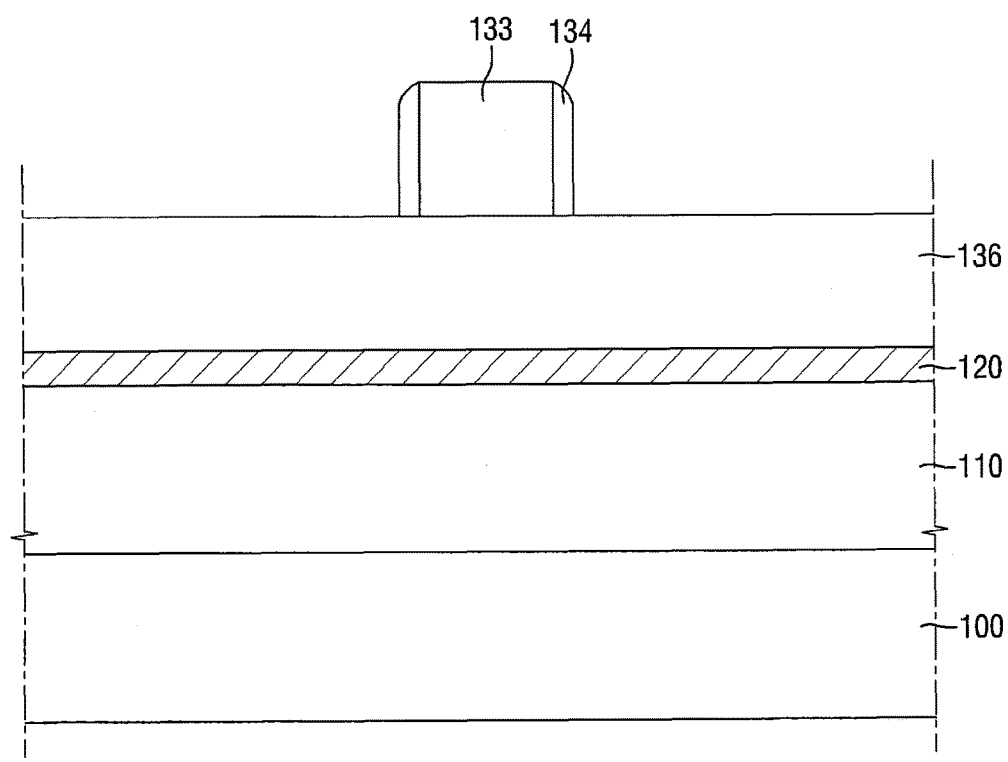
Figure 3E:
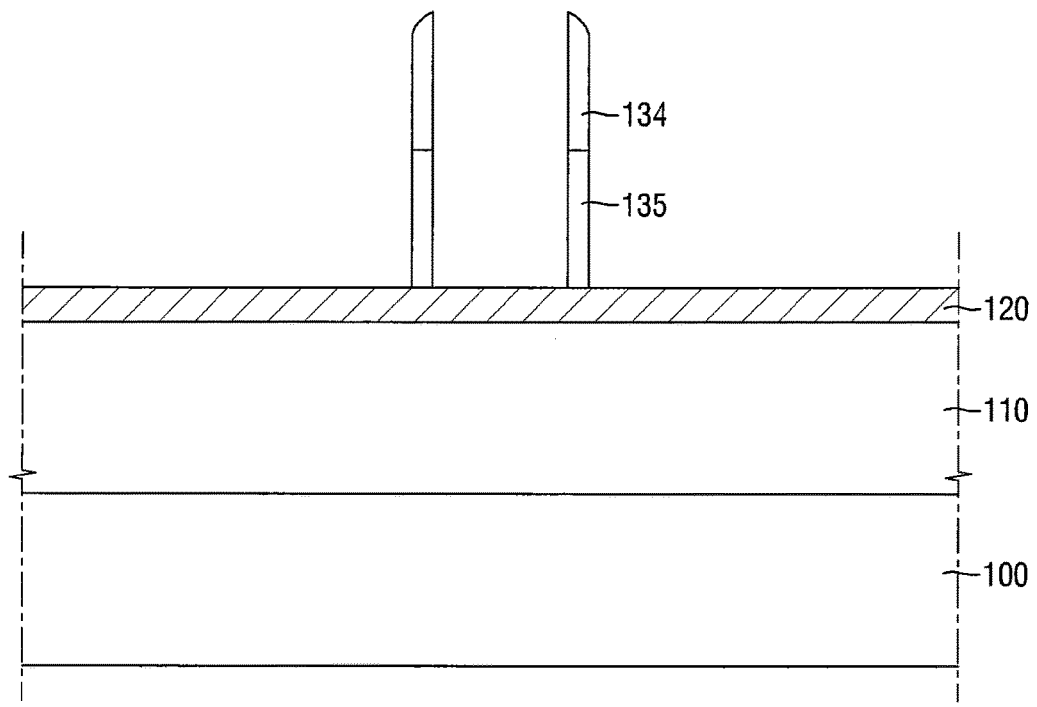

Referring to FIGS. 1, 2B and 3E, a lower film 110 and a hard mask film 120 may be formed on a substrate 100.

In some embodiments, the substrate 100 may include a base substrate and an epitaxial layer grown on the base substrate, but not limited thereto. In some embodiments, the substrate 100 may include the base substrate only and may not include the epitaxial layer. The substrate 100 may be a silicon substrate, a gallium arsenide substrate, a silicon germanium substrate, a ceramic substrate, a quartz substrate, or a glass substrate for display, or a semiconductor on insulator (SOI) substrate.

Further, the substrate 100 may include a circuit pattern which may be formed within or on the substrate 100. For example, the circuit pattern may include a transistor, a diode, a capacitor, and so on. In some example embodiments, the substrate 100 may not include a circuit pattern.

The lower film 110 may be formed on the substrate 100. For example, the lower film 110 may include at least one of silicon oxide, silicon nitride, silicon oxynitride and a low-k dielectric material.

For example, the low-k dielectric material may include flowable oxide (FOX), Tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The lower film 110 may be formed by, for example, a chemical vapor deposition (CVD) process, a spin coating process, a plasma enhanced CVD process, a high density plasma CVD process, and so on.

As illustrated, the lower film 110 may be a single-layered film, but this is provided only for convenience of explanation and the present inventive concept is not limited thereto.

The hard mask film 120 may be formed on the lower film 110. The hard mask film 120 may include at least one of, for example, titanium nitride, titanium, titanium oxide, tungsten, tungsten nitride, tungsten oxide, tantalum, tantalum nitride and tantalum oxide.

Hereinbelow, a method of fabricating a semiconductor device according to example embodiments will be described, in which metal interconnects are formed in the lower film 110 using the hard mask film 120 in the back end of line (BEOL) process. However, these are provided only for convenience of explanation, and the present inventive concept is not limited thereto.

The method of fabricating a semiconductor device according to example embodiments may also be implemented in the front end of line (FEOL), instead of the BEOL process. The method of fabricating a semiconductor device according to example embodiments may be used for patterning a semiconductor film or a conductive film using the hard mask film 120.

Additionally, the method of fabricating a semiconductor device according to example embodiments may be used for patterning the substrate 100 which uses the hard mask film 120, without forming the lower film 110 between the substrate 100 and the hard mask film 120.

A first mask pattern 135 may be formed on the hard mask film 120. The first mask pattern 135 may include polycrystalline silicon, amorphous carbon layer (ACL) and/or spin-on hardmask (SOH).

The first mask pattern 135 may be formed using a variety of methods. Hereinbelow, example methods of forming the first mask pattern 135 will be described.

For example, the first mask pattern 135 may be formed by the method described with reference to FIGS. 2A and 2B and/or the method described with reference to FIGS. 2A to 3E, but not limited thereto.

A method of forming the first mask pattern 135 will be described with reference to FIGS. 2A and 2B.

Referring to FIG. 2A, a first mask film 136 may be formed on the hard mask film 120. The first mask film 136 may include, for example, polycrystalline silicon, ACL, and/or SOH.

The first mask film 136 may be formed by the process such as, for example, an atomic layer deposition (ALD) process, a chemical vapor deposition (CVD) process, a spin coating process and so on, and depending on materials used, baking and/or curing process may be added.

A first pattern film 137 may be formed on the first mask film 136. The first pattern film 137 may include, for example, silicon oxide, silicon oxynitride, silicon nitride, photoresist, and so on, but not limited thereto.

Referring to FIG. 2B, the first mask film 136 may be etched using the first pattern film 137 as a mask (e.g., etching mask). As a result, the first mask pattern 135 may be formed on the hard mask film 120.

A method of forming the first mask pattern 135 will be described with reference to FIGS. 3A and 3E.

The first mask film 136 and the second mask film 131 may be sequentially formed on the hard mask film 120. The first mask film 136 and the second mask film 131 may each include, for example, polycrystalline silicon, ACL and/or SOH.

A capping layer may be additionally formed between the first mask film 136 and the second mask film 131. When the capping layer is additionally formed, the capping layer may include a material having an etch selectivity with respect to the second mask film 131.

A second pattern film 132 may be formed on the second mask film 131. The second pattern film 132 may include, for example, silicon oxide, silicon oxynitride, silicon nitride, photoresist, and so on, but not limited thereto.

Referring to FIG. 3B, the second mask film 131 may be etched using the second pattern film 132 as a mask (e.g., etching mask). As a result, the second mask pattern 133 may be formed on the first mask film 136.

The second pattern film 132 on the second mask pattern 133 may be removed.

Referring to FIG. 3C, a spacer film 134p may be formed along an upper surface of the first mask film 136, and an upper surface and a sidewall of the second mask pattern 133.

The spacer film 134p may include, for example, silicon oxide, silicon oxynitride, silicon nitride, and so on. The spacer film 134p may be formed by, for example, an ALD process, a CVD process, and so on.

Referring to FIG. 3D, a spacer 134 may be formed on the sidewall of the second mask pattern 133 by performing an anisotropic etching process on the spacer film 134p. As a result, the spacer 134 may be formed on the first mask film 136.

The second mask pattern 133 on the first mask film 136 may be removed after the spacer 134 is formed.

Referring to FIG. 3E, the first mask film 136 may be etched using the spacer 134 as a mask (e.g., etching mask). As a result, the first mask pattern 135 may be formed on the hard mask film 120.

Figure 4:
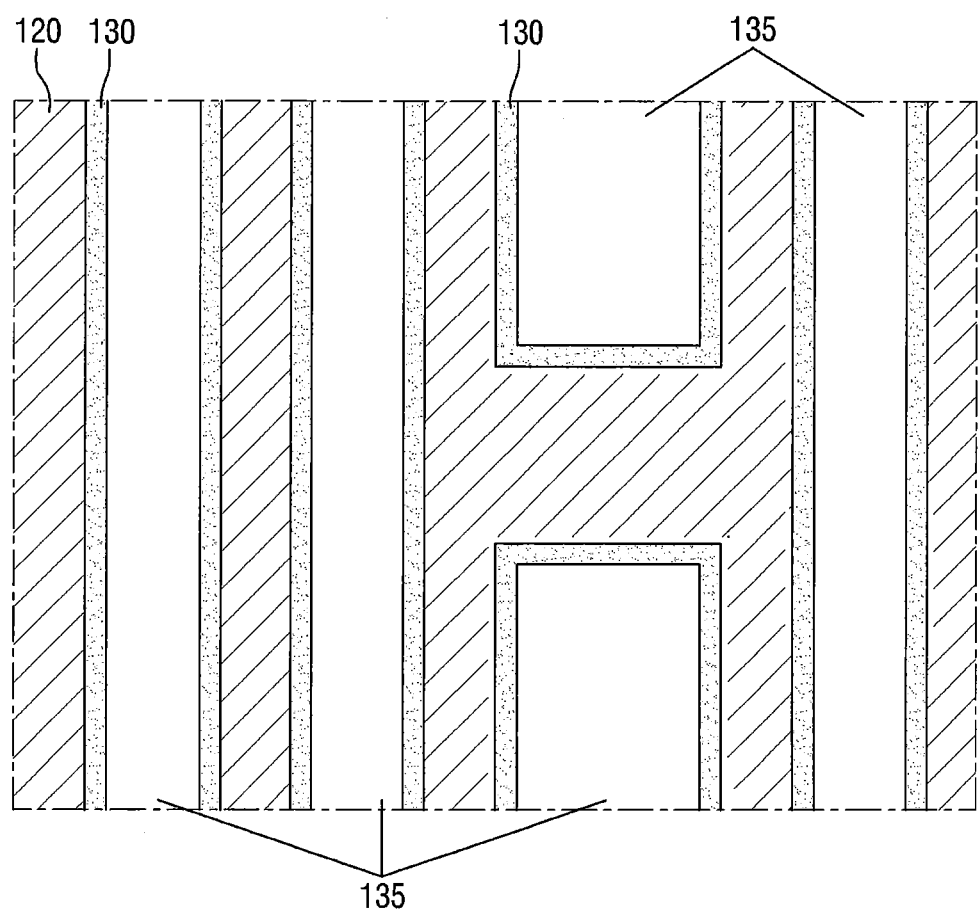

Referring to FIG. 4, spacers 130 may be formed on the hard mask film 120. The spacers 130 may be formed on the sidewalls of the first mask pattern 135.

In some embodiments, a pre-spacer film may be formed along the upper surface of the hard mask film 120, and the sidewalls and the upper surfaces of the first mask pattern 135. The spacers 130 may be formed on the sidewalls of the first mask pattern 135 by performing an anisotropic etching process on the pre-spacer film.

When the first mask pattern 135 includes a long side and a short side, there may be spacers 130 formed on the sidewalls each including the long side and the short side of the first mask pattern 135. Accordingly, the spacers 130 may be formed along a perimeter of the first mask pattern 135.

The spacers 130 may include, for example, silicon oxide, silicon oxynitride, silicon nitride, and so on.

The spacers 130 formed on the sidewalls of the first mask pattern 135 as a result of the processes in FIGS. 2A and 2B may be the spacers formed by self-aligned-double-patterning (SADP).

Further, the spacers 130 formed on the sidewall of the first mask pattern 135 as a result of the processes in FIGS. 3A to 3E may be the spacer formed by self-aligned-quadruple-patterning (SAQP).

Accordingly, the spacers 130 may be a combination of the spacers formed by the SADP and/or the spacers formed by the SAQP.

Figure 5A:
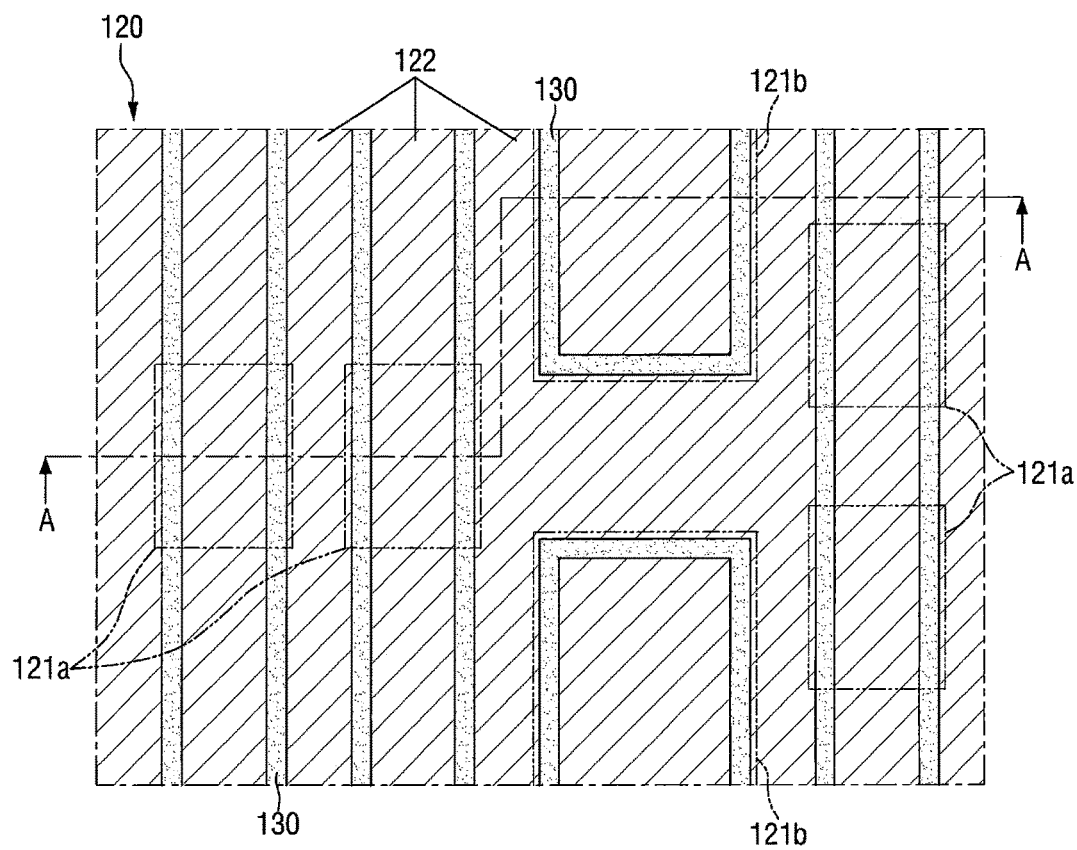
Figure 5B:
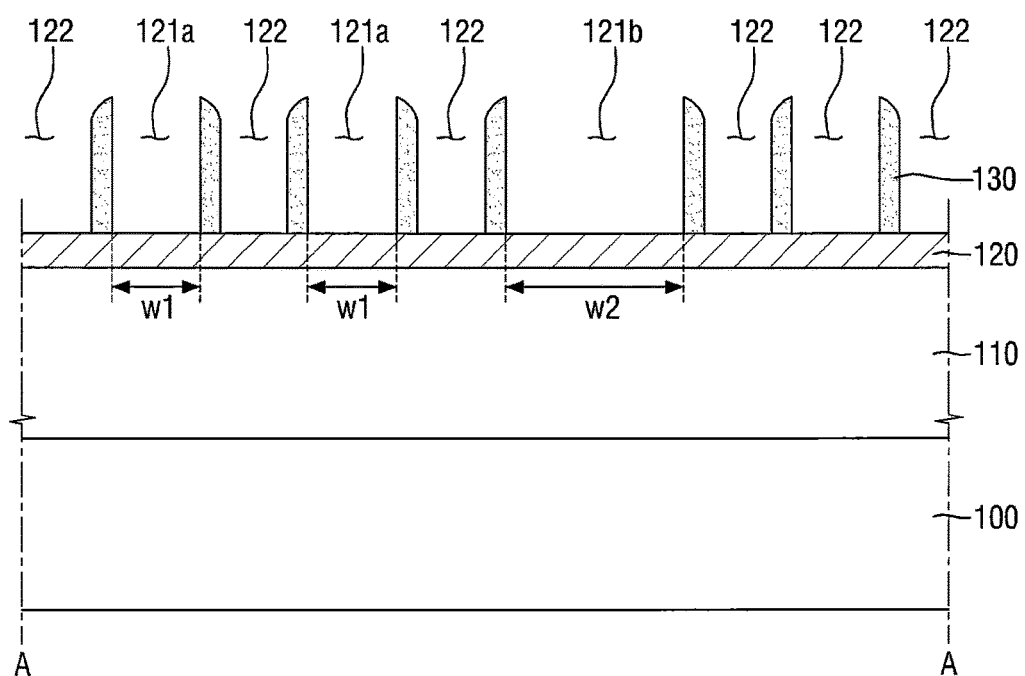

Referring to FIGS. 5A and 5B, the first mask pattern 135 surrounded by the spacers 130 may be removed. The spacers 130 may be considered as preliminary masks.

By the removal of the first mask pattern 135, the spacers 130 on the hard mask film 120 may define an exposure region of the hard mask film 120.

The "exposure region" of the hard mask film 120 as used herein refers to a region that does not vertically overlap the spacers 130. It will be understood that "an element A vertically overlapping an element B" (or similar language) means that a vertical line exists that intersects both the elements A and B.

Further, it will be understood that the exposure region of the hard mask film 120 does not refer to a region of the hard mask film 120 that is exposed by the spacers 130. In some embodiments, an insertion film may be additionally formed between the hard mask film 120 and the spacers 130, and the exposure region of the hard mask film 120 may be covered by the insertion film.

The exposure region of the hard mask film 120 may include patterning portions 122, and non-patterning portions 121a, 121b. The patterning portions 122 may refer to portions of the hard mask film 120 which are to be etched and patterned in a subsequent etching process. The non-patterning portions 121a, 121b may refer to portions of the hard mask film 120 that are covered by the spacers 130 and so on, and thus not to be etched in a subsequent etching process.

The patterning portions 122 and the non-patterning portions 121a, 121b may be determined before fabricating a semiconductor device.

The non-patterning portions 121a, 121b may include first non-patterning portions 121a and a second non-patterning portion 121b having different widths.

When the non-patterning portions 121a, 121b are defined to be in rectangular shapes as illustrated, the widths of the non-patterning portions 121a, 121b may correspond to distances between long sides of the rectangles. When the non-patterning portions 121a, 121b are defined to be in a shape combining a plurality of rectangles, the widths of the non-patterning portions 121a, 121b may be the shortest distance among distances between long sides of the respective rectangles.

In describing a method of fabricating a semiconductor device according to some example embodiments, it will be assumed that the width W1 of the first non-patterning portions 121a is smaller than the width W2 of the second non-patterning portion 121b.

As illustrated in FIGS. 5A and 5B, the non-patterning portions 121a, 121b of the exposure region of the hard mask film 120 may have two different widths W1, W2, but this is provided only for convenience of explanation and the present inventive concept is not limited thereto.

In some embodiments, the non-patterning portions 121a, 121b of the exposure region of the hard mask film 120 may have the same width, or three or more different widths.

Figure 6A:
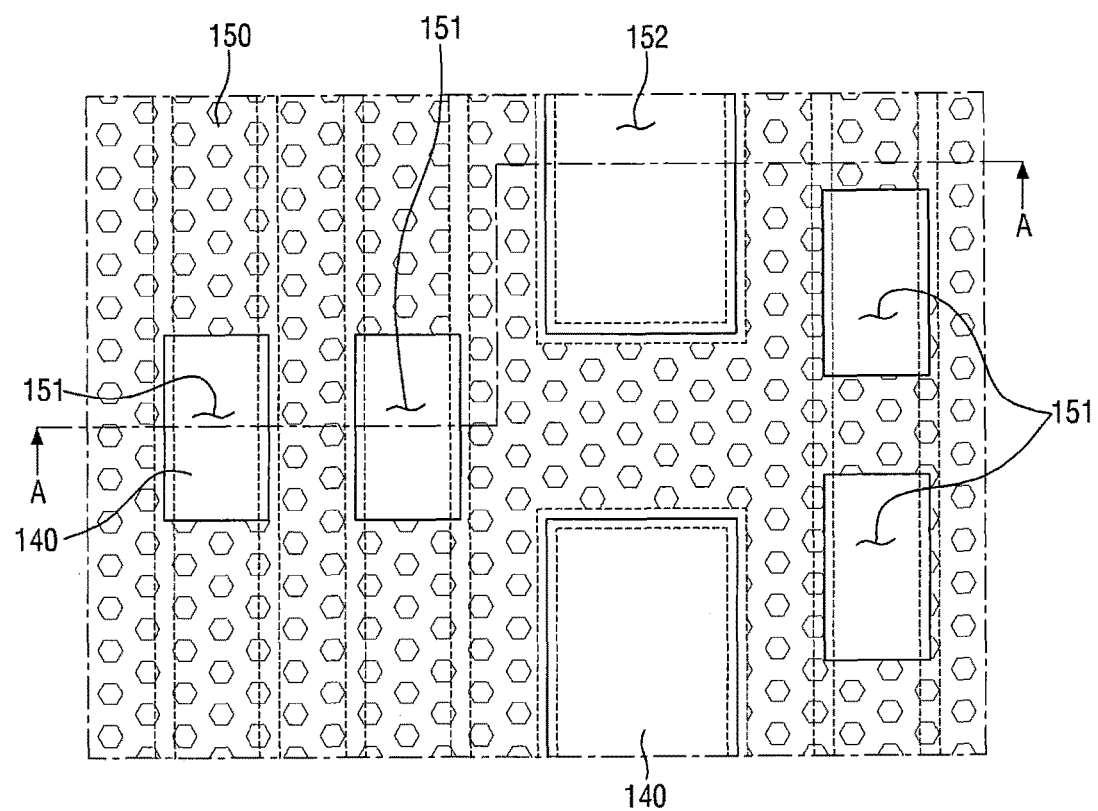
Figure 6B:
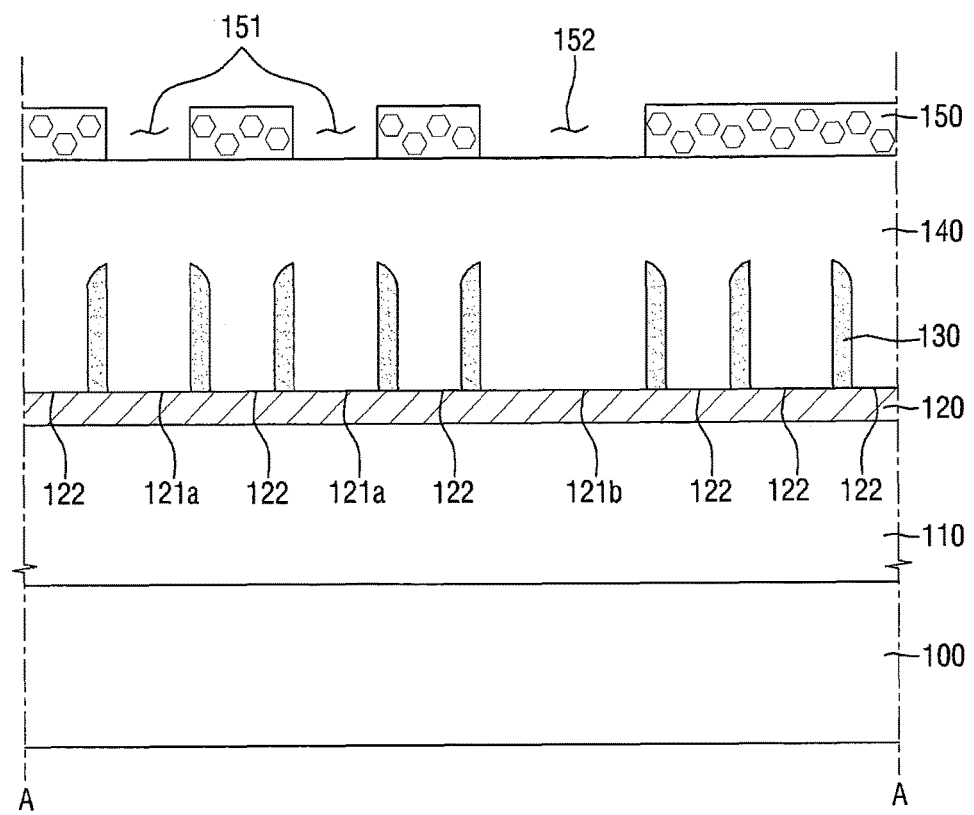

Referring to FIGS. 6A and 6B, a first mold film 140 may be formed on the hard mask film 120 and the spacers 130. The first mold film 140 may cover the spacers 130. It will be understood that "an element A covers an element B" (or similar language) means that the element A is on the element B but does not necessarily mean that the element A covers the element B entirely.

The first mold film 140 covering the spacers 130 may include a flat upper surface as illustrated in FIG. 6B. The first mold film 140 may include a material having an etch selectivity with respect to the spacers 130.

The first mold film 140 may include, for example, silicon oxide, amorphous silicon, amorphous carbon layer (ACL), spin-on hardmask (SOH), and so on, but not limited thereto.

A first photoresist pattern 150 may be formed on the first mold film 140.

The first photoresist pattern 150 may include first openings 151 and a second opening 152. The first openings 151 and the second opening 152 may vertically overlap the non-patterning portions 121a, 121b, respectively. The first photoresist patterns 150 may cover and may vertically overlap the respective patterning portions 122.

The first openings 151 may vertically overlap the respective first non-patterning portions 121a, and the second opening 152 may vertically overlap the second non-patterning portion 121b.

A photoresist PR may be formed on the first mold film 140 and then the first photoresist pattern 150 may be formed by a photolithography process. As illustrated in FIG. 6B, the first photoresist pattern 150 may be a single layer, but this is provided only for convenience of explanation and the present inventive concept is not limited thereto.

In some embodiments, the first photoresist pattern 150 may include an anti-reflective layer to reduce or possibly prevent light from reflecting against an underlying layer during a photolithography process. The anti-reflective layer may include, for example, bottom anti-reflective coating (BARC) and/or developable bottom anti-reflective coating (dBARC), but not limited thereto.

Figure 7A:
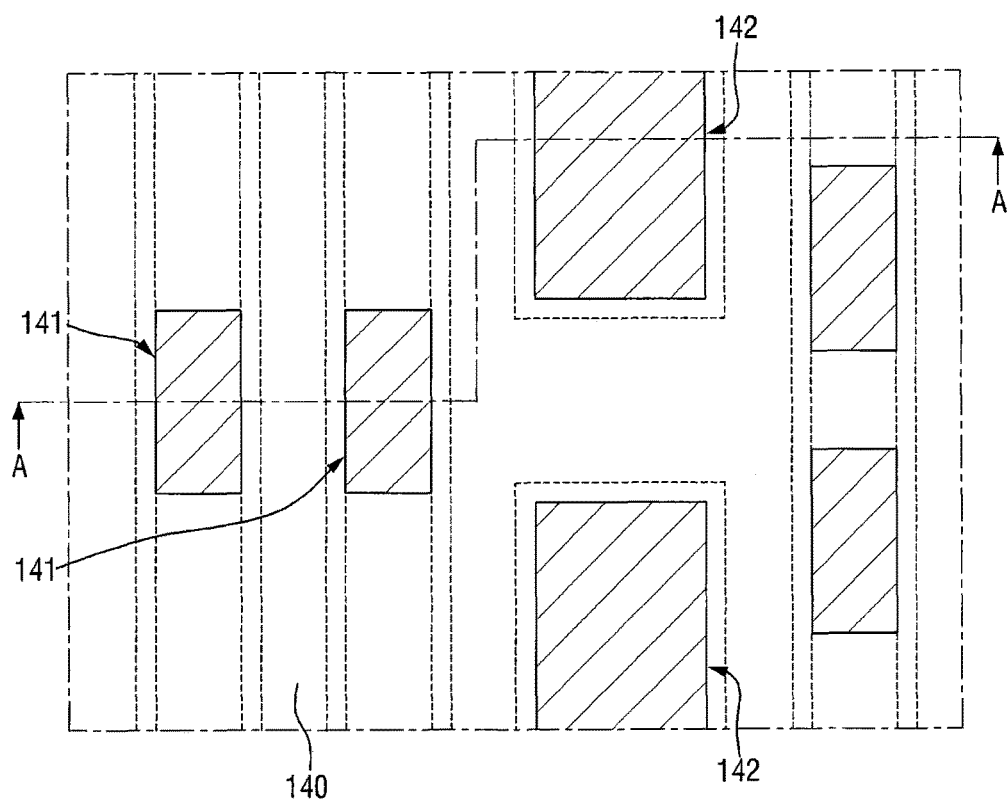
Figure 7B:
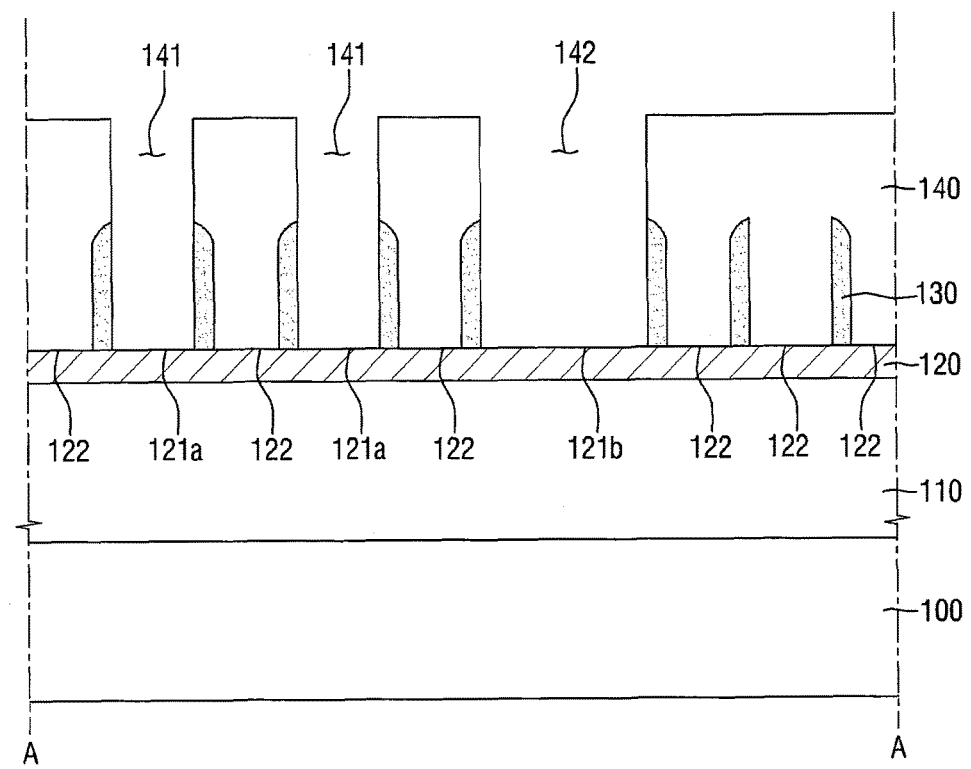

Referring to FIGS. 7A and 7B, the first mold film 140 may be etched using the first photoresist pattern 150 as an etching mask. As a result, first holes 141 and a second hole 142 may be formed in the first mold film 140.

The first holes 141 may be formed by removing portions of the first mold film 140 which are exposed through the first openings 151. Accordingly, the first holes 141 may vertically overlap the respective first non-patterning portions 121a. Each of the first holes 141 may be between a first pair of the spacers 130 and may expose sides of the first pair of the spacers 130 as illustrated in FIG. 7B.

The second hole 142 may be formed by removing a portion of the first mold film 140 exposed through the second opening 152, and accordingly, the second hole 142 may vertically overlap the second non-patterning portion 121b. The second hole 142 may be between a second pair of the spacers 130 and may expose sides of the second pair of the spacers 130 as illustrated in FIG. 7B.

The first holes 141 and the second hole 142 may be concurrently formed in the first mold film 140 using the first photoresist pattern 150 as an etching mask. It will be understood that "formed concurrently" refers to formed in a same fabrication step, at approximately (but not necessarily exactly) the same time.

The first photoresist pattern 150 may be removed after the first holes 141 and the second hole 142 are formed.

Figure 8:
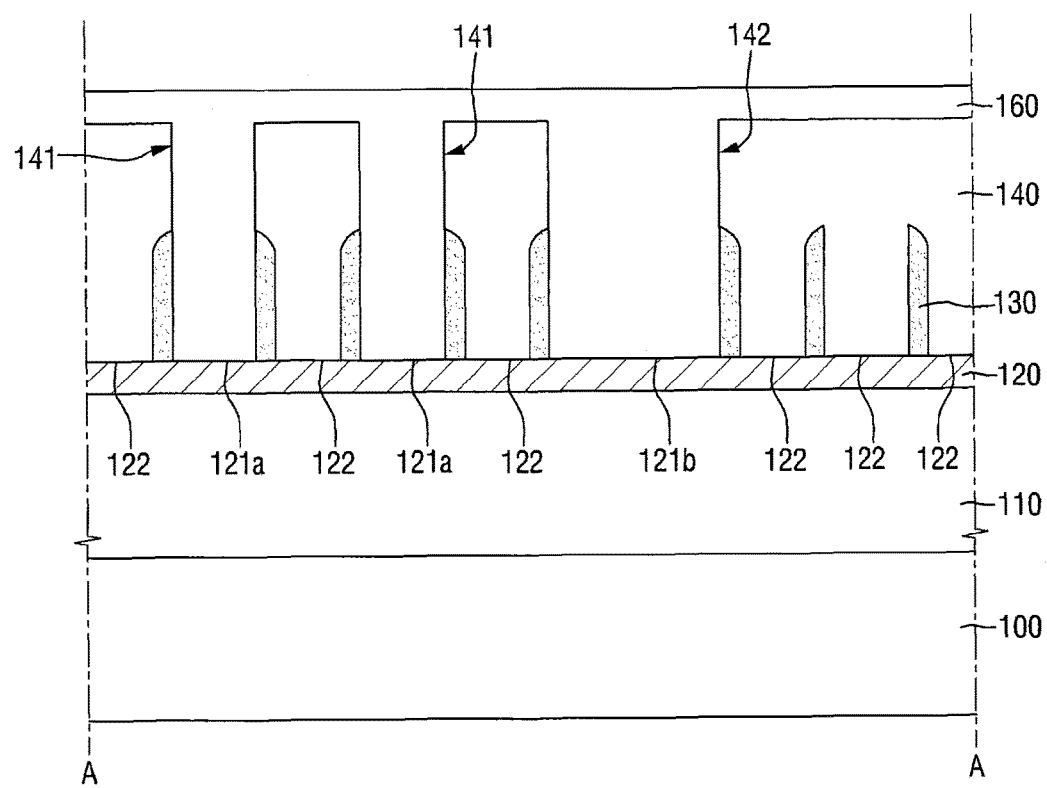
Figure 9:
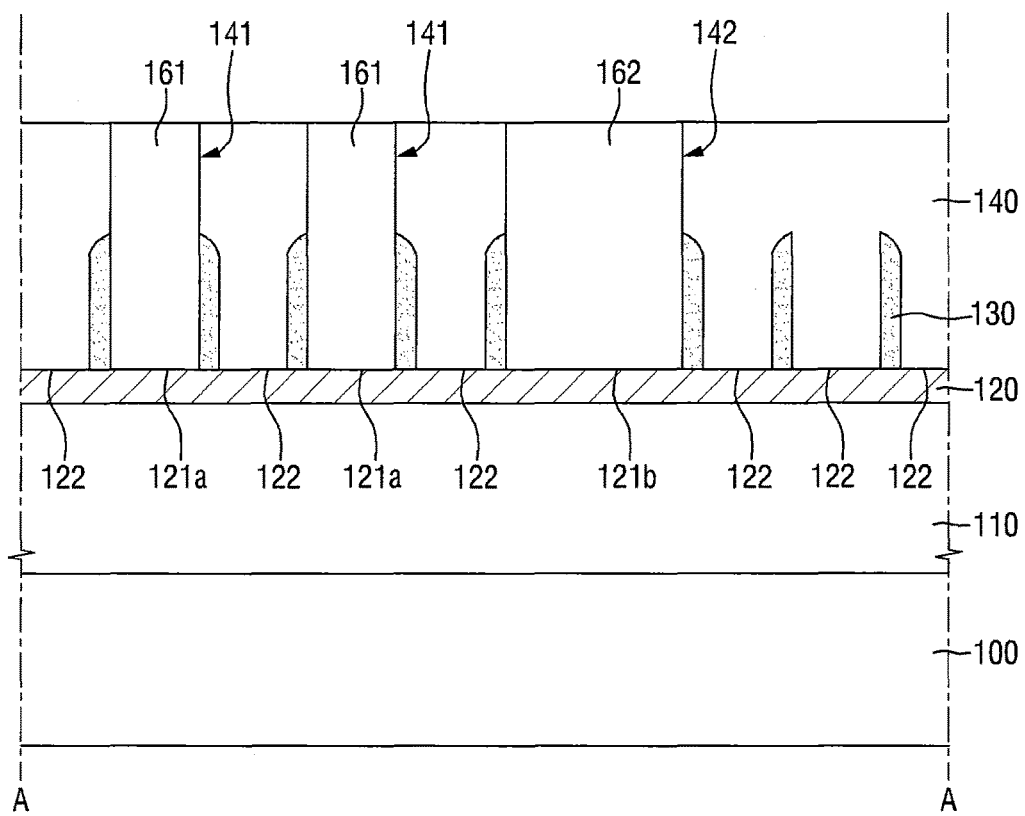

Referring to FIGS. 8 and 9, a first blocking film 160 filling the first holes 141 and the second hole 142 may be formed on the hard mask film 120. The first blocking film 160 may cover an upper surface of the first mold film 140.

The first blocking film 160 may include a material having an etch selectivity with respect to the first mold film 140.

The first blocking film 160 may include material having good gap-fill ability. For example, the first blocking film 160 may include spin-on hardmask (SOH), flowable CVD (FCVD) oxide, Tonen silazen (TOSZ), and so on, but not limited thereto. In some embodiments, the first blocking film 160 may include a silicon oxide which is formed by an atomic layer deposition (ALD) process.

The first blocking patterns 161 and the second blocking pattern 162 may be formed in the first mold film 140 by removing a portion of the first blocking film 160 formed on the upper surface of the first mold film 140.

The first blocking patterns 161, which are formed by filling the first holes 141 in the first mold film 140, may be formed on the first non-patterning portions 121a. The second blocking pattern 162, which is formed by filling the second hole 142 in the first mold film 140, may be formed on the second non-patterning portion 121b. Each of the first blocking patterns 161 may contact the first pair of the spacers 130 between which one of the first holes 141 is formed. The second blocking pattern 162 may contact the second pair of the spacers 130 between which the second hole 142 is formed.

Because the first blocking film 160 fills both the first holes 141 and the second hole 142 concurrently, the first blocking patterns 161 and the second blocking pattern 162 may be formed concurrently.

The first blocking patterns 161 may vertically overlap the respective first non-patterning portions 121a, and the second blocking pattern 162 may vertically overlap the second non-patterning portion 121b. The patterning portions 122 may be covered by the first mold film 140.

Figure 10A:
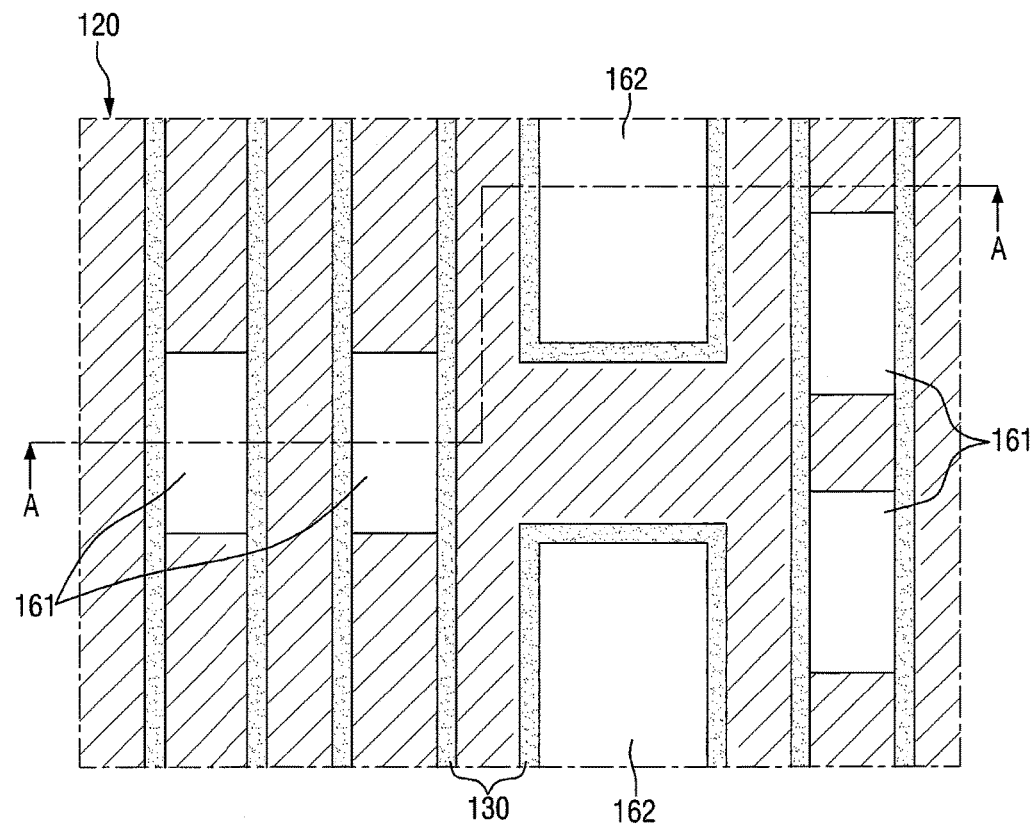
Figure 10B:
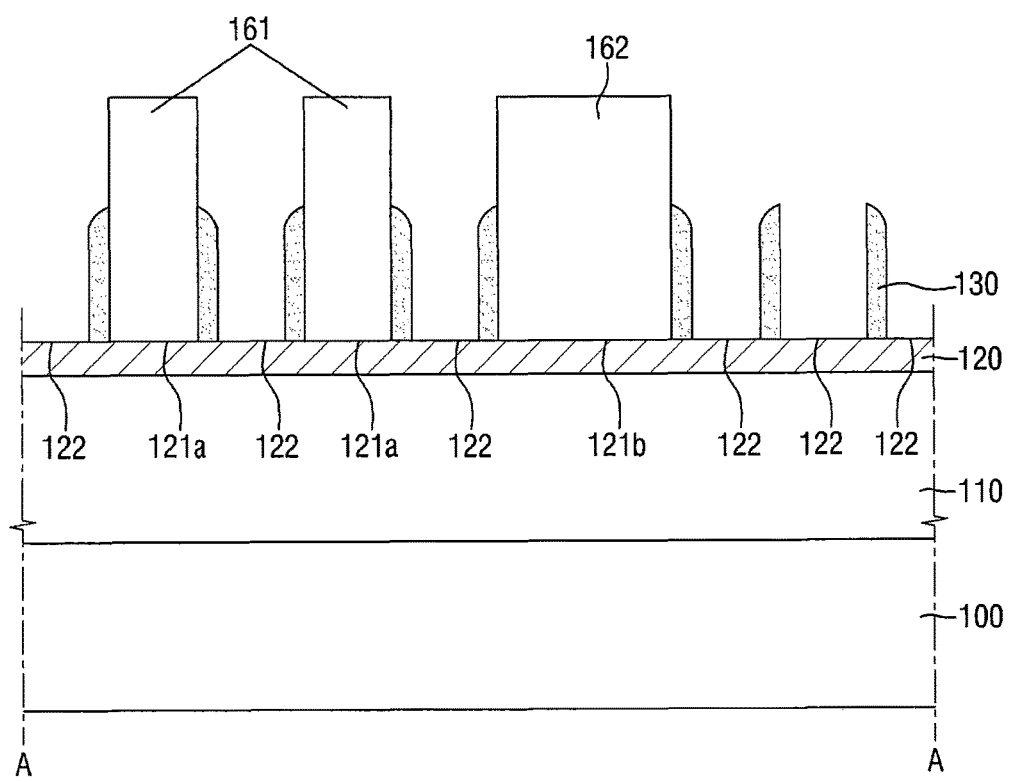

Referring to FIGS. 10A and 10B, the first mold film 140 on the hard mask film 120 may be removed. The first blocking patterns 161 and the second blocking pattern 162 on the hard mask film 120 may remain.

In some embodiments, portions of the first mold film 140 formed on the patterning portions 122 may be removed as illustrated in FIG. 10B. By the removal of the first mold film 140, the spacers 130 on the hard mask film 120 may be exposed. Removing the first mold film 140 may expose opposing sides of each of a third pair of the spacers 130 between which one of the patterning portions 122 is disposed as illustrated in FIG. 10B.

The first blocking patterns 161 and the second blocking pattern 162 may include a material having an etch selectivity with respect to the first mold film 140, and the spacers 130 may include a material having an etch selectivity with respect to the first mold film 140. As a result, the first mold film 140 may be selectively removed by an etching process. Stated in other words, an etching process removing the first mold film 140 may not remove the first blocking patterns 161, the second blocking pattern 162 and the spacers 130.

Figure 11:
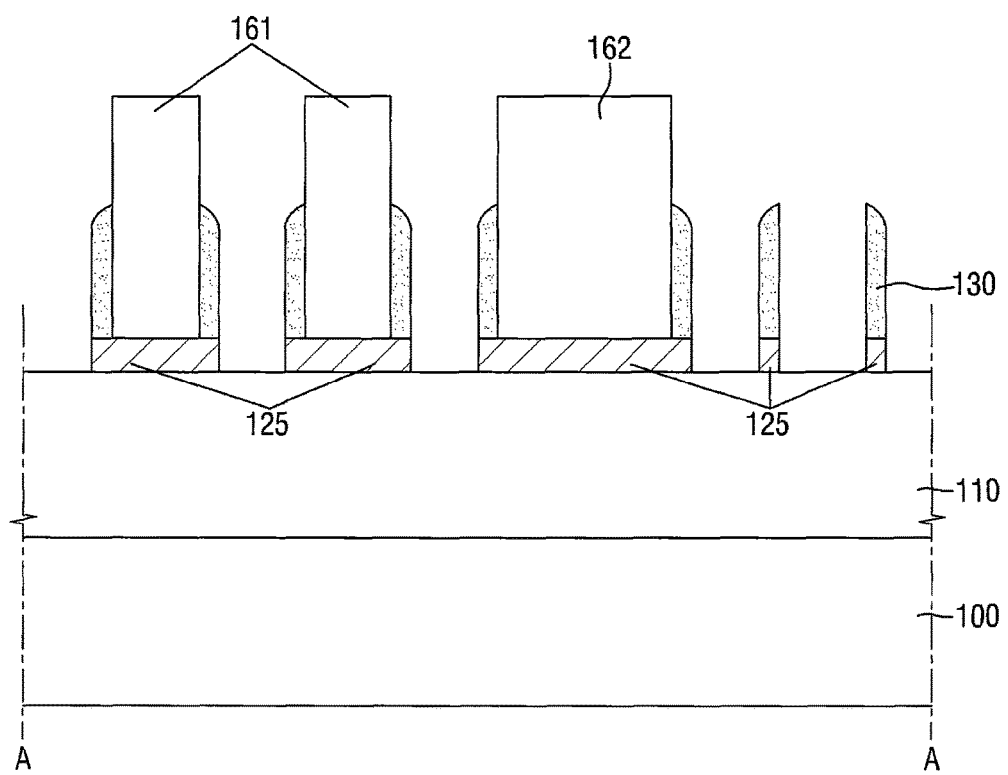
Figure 12:
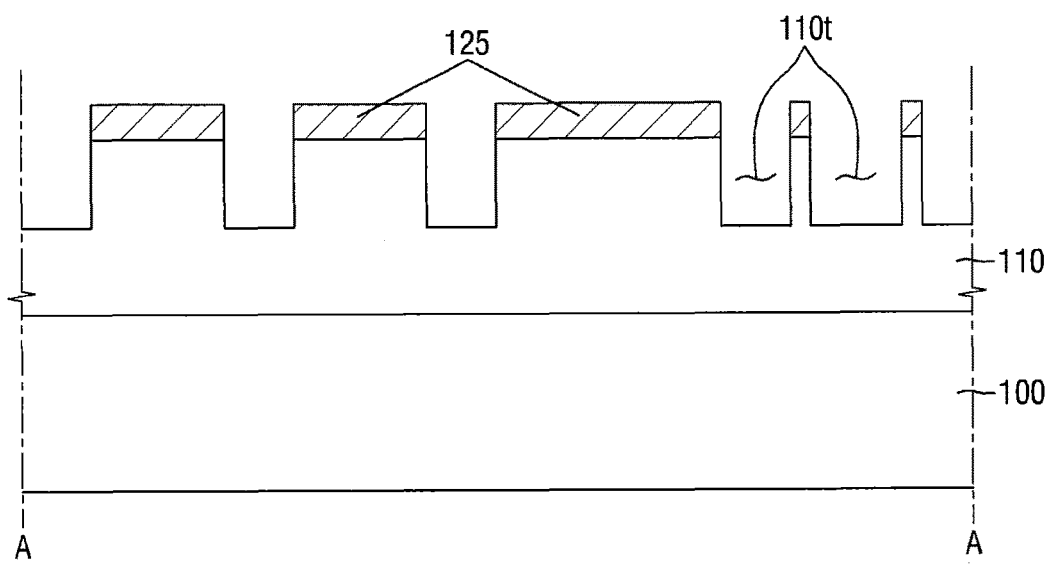

Referring to FIGS. 11 and 12, the first blocking patterns 161, the second blocking pattern 162 and the spacers 130 may be used as an etching mask to etch the hard mask film 120.

In other words, the patterning portions 122 of the hard mask film 120 may be etched using the first blocking patterns 161, the second blocking pattern 162 and the spacers 130 as an etching mask.

By the removal of the patterning portions 122 of the hard mask film 120, the hard mask pattern 125 may be formed on the lower film 110.

Trenches 110t may be formed in the lower film 110 by etching the lower film 110 using the hard mask pattern 125 as an etching mask.

Since the hard mask pattern 125 is formed by etching of the patterning portions 122 in FIG. 10B of the hard mask film 120, the trenches 110t may be formed at locations corresponding the patterning portions 122 of the hard mask film 120.

The first blocking patterns 161, the second blocking pattern 162, and the spacers 130, which are used as the etching mask for forming the hard mask pattern 125, may be removed before the trenches 110t are formed in the lower film 110, or after the trenches 110t are formed in the lower film 110.

Figure 13:
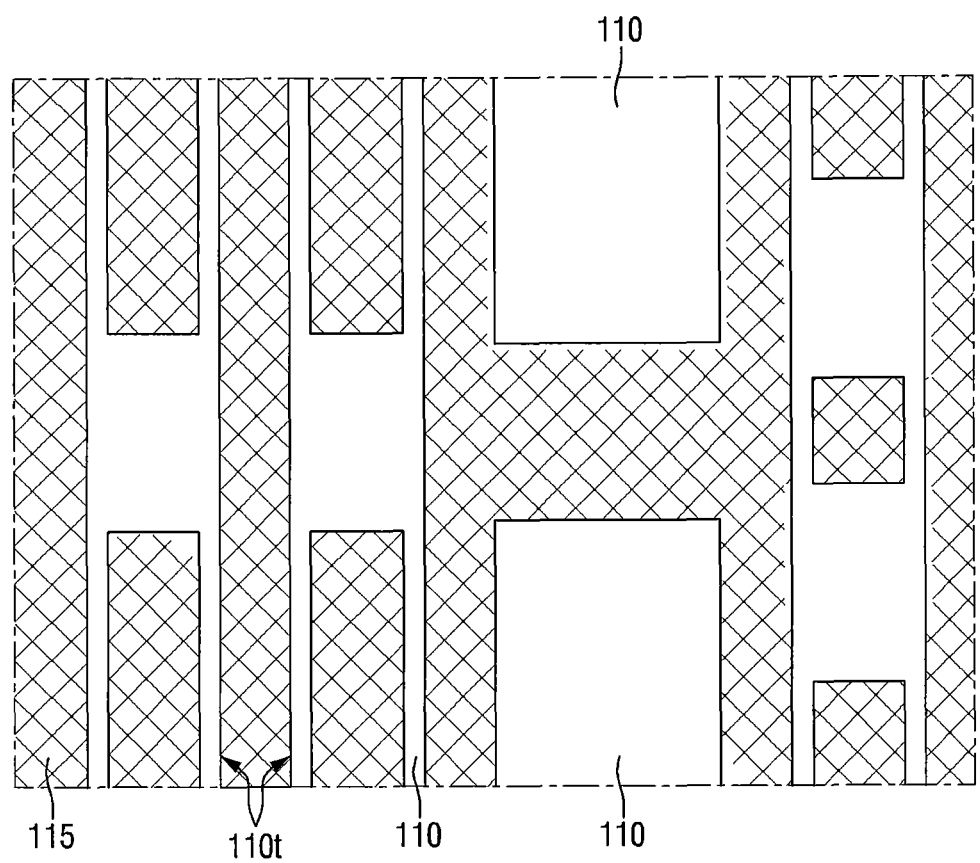

Referring to FIG. 13, a conductive material may fill the trenches 110t formed in the lower film 110, to form a conductive pattern 115 in the lower film 110.

The conductive pattern 115 may include, for example, aluminum (Al), copper (cu), tungsten (W), cobalt (Co), and a combination of these.

Although not illustrated, a barrier film may be additionally formed between the conductive pattern 115 and the lower film 110. The barrier film may be formed along sidewalls and bottom surfaces of the trenches 110t. The barrier film may include a material such as, for example, tantalum, tantalum nitride, titanium, titanium nitride, ruthenium, cobalt, nickel, nickel boron (NiB), tungsten nitride, and so on.

The hard mask pattern 125 on the lower film 110 may be removed before the conductive pattern 115 is formed, but not limited thereto. The hard mask pattern 125 on the lower film 110 may be removed after the conductive pattern 115 is formed.

A method of fabricating a semiconductor device according to some example embodiments of the inventive concept will be described below with reference to FIGS. 1 to 5B, and FIGS. 9 to 20.

FIGS. 14A through 20 are views illustrating a method of fabricating a semiconductor device according to some example embodiments of the inventive concept.

Figure 14A:
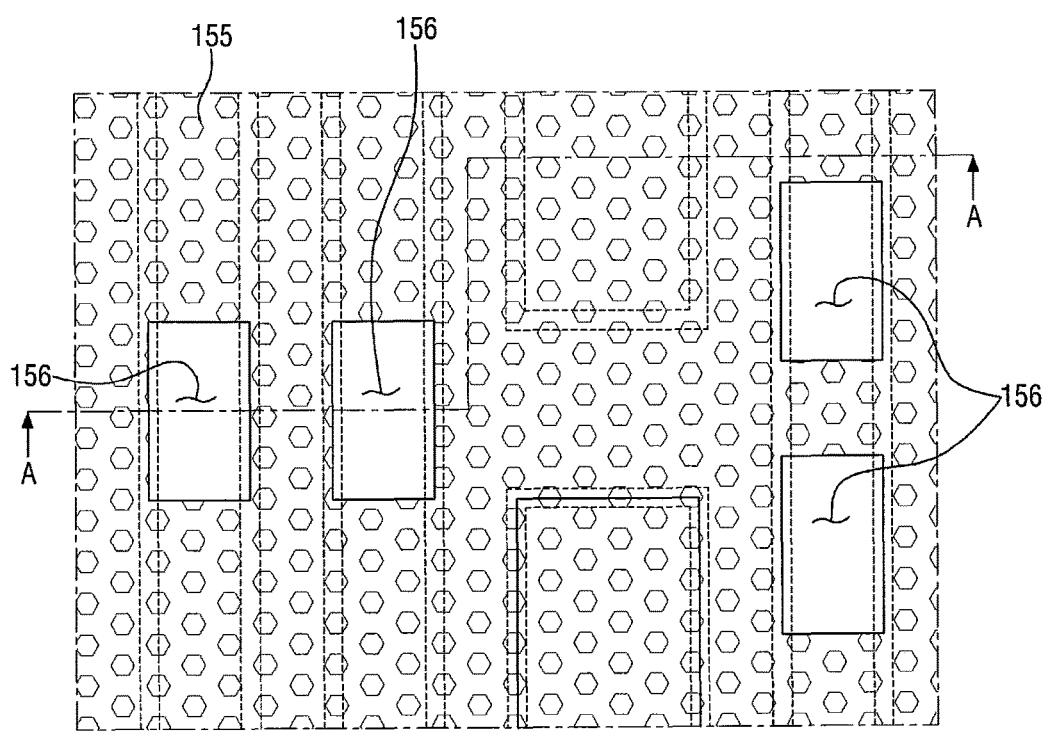
FIGS. 14A through 20 are views a method of fabricating a semiconductor device according to some example embodiments of the present inventive concept.
Figure 14B:
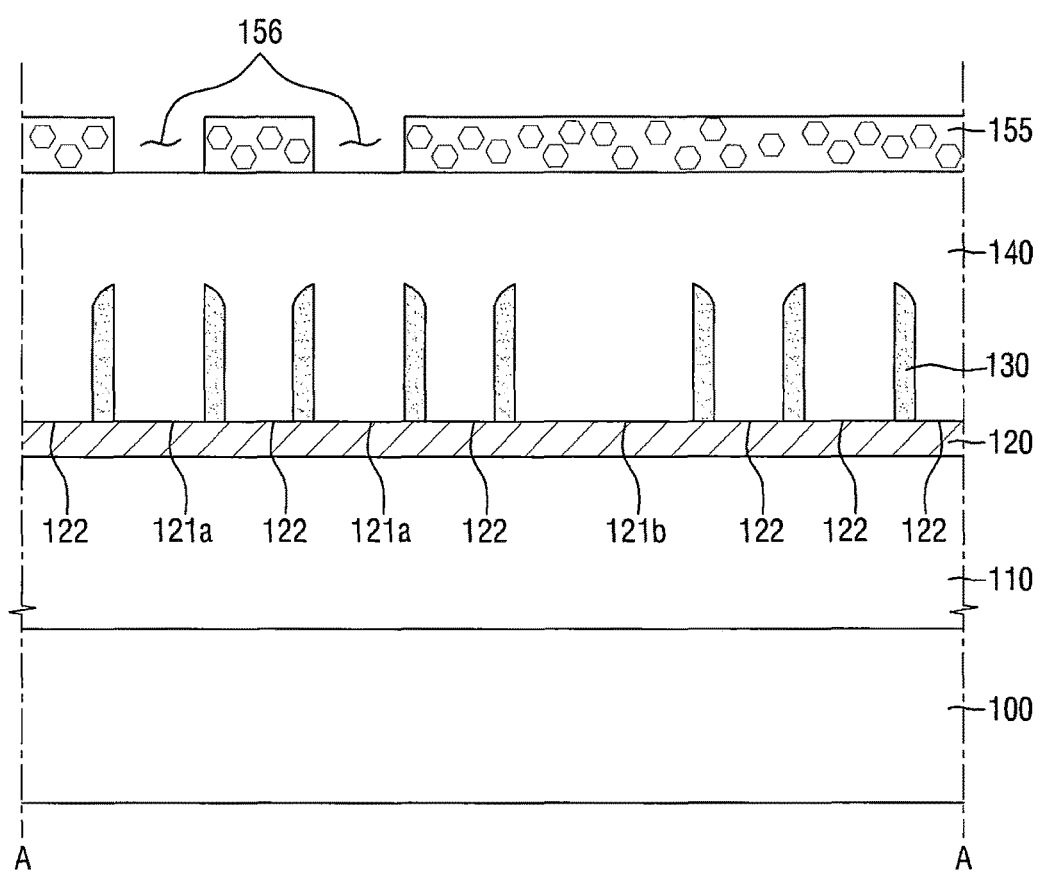
Figure 15A:
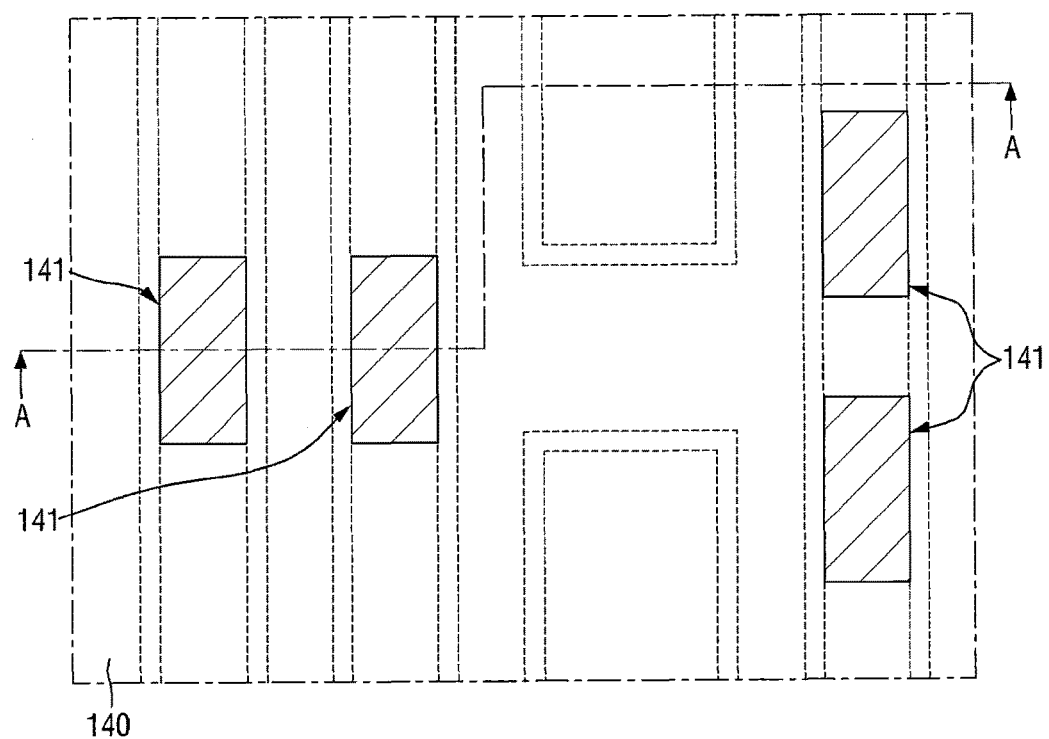
Figure 15B:
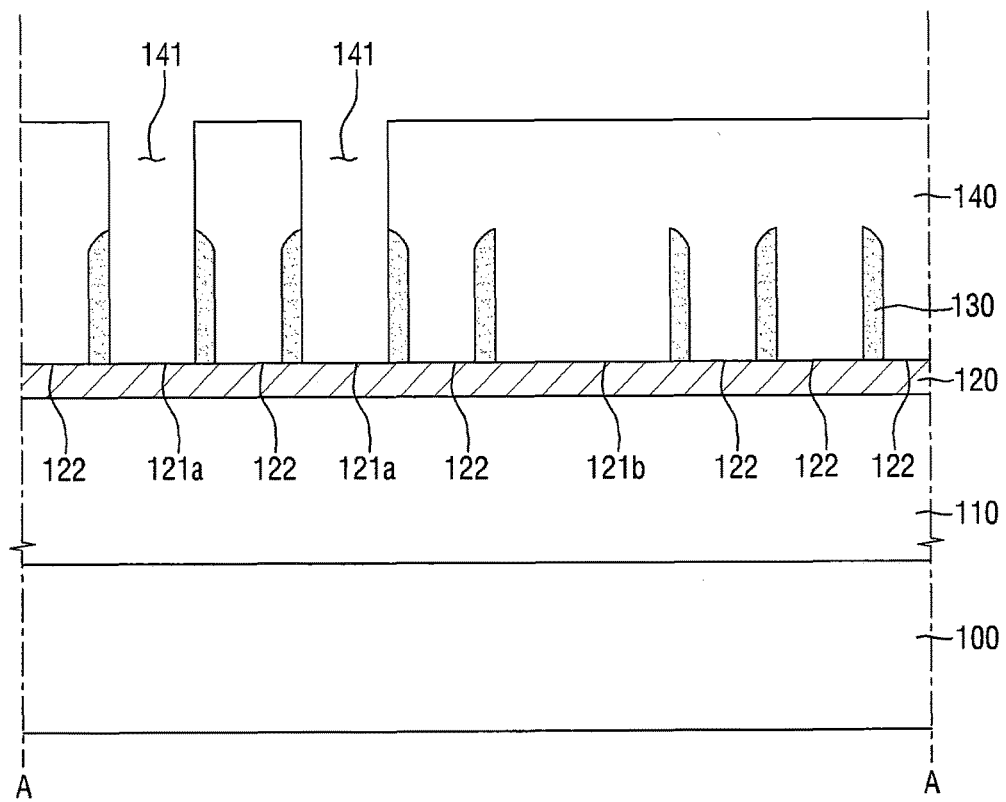
Figure 18A:
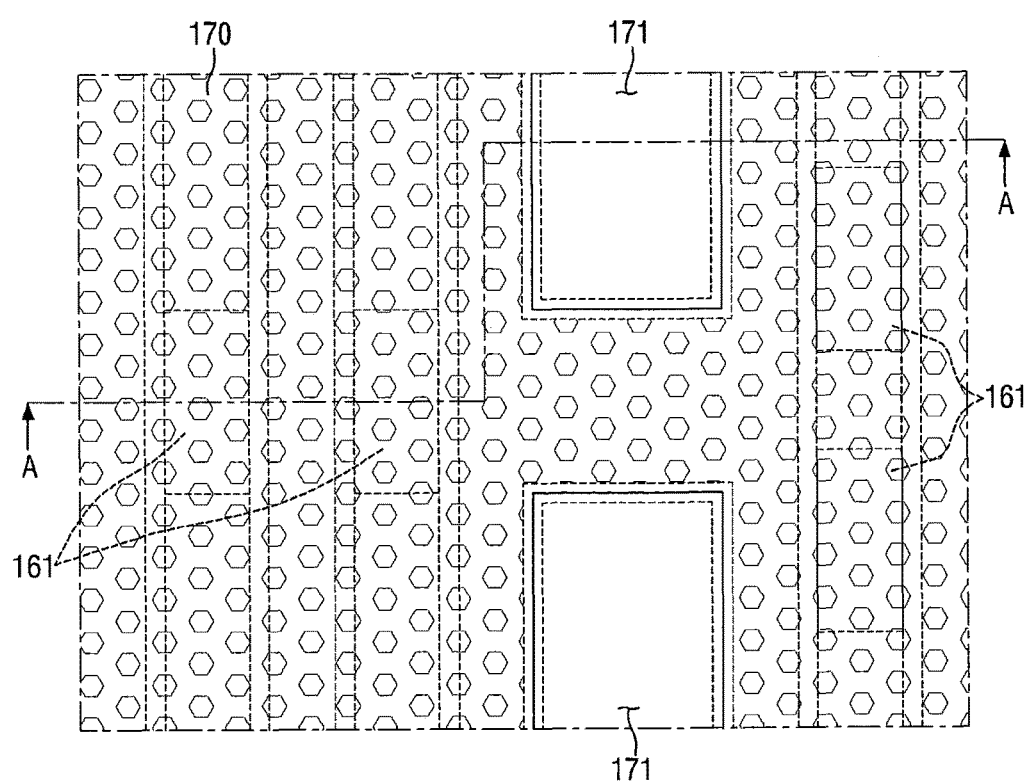
Figure 18B:
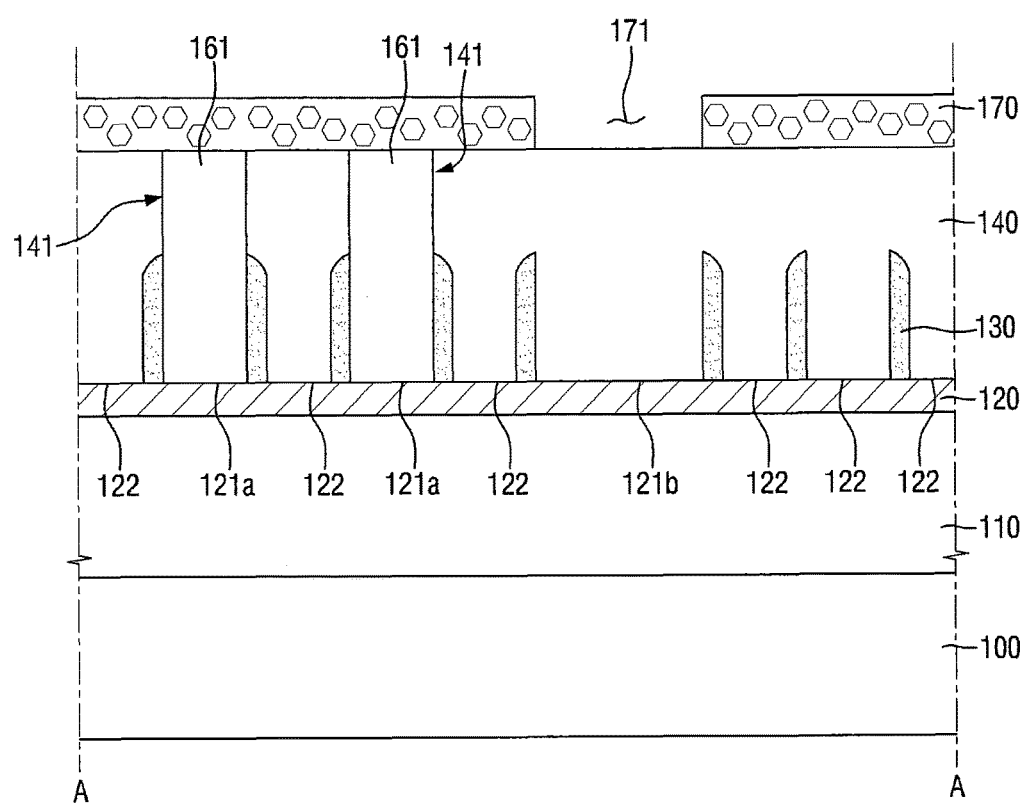

FIGS. 14B, 15B and 18B are cross sectional views taken along the line A-A of FIGS. 14A, 15A and 18A, respectively. FIGS. 14A and 14B may be the views illustrating a process which is performed after FIGS. 5A and 5B.

Referring to FIGS. 14A and 14B, the first mold film 140 covering the spacers 130 may be formed on the hard mask film 120 and the spacers 130.

The second photoresist pattern 155 including third openings 156 may be formed on the first mold film 140.

The third openings 156 may vertically overlap the first non-patterning portions 121a. The second photoresist pattern 155 may cover the patterning portions 122 and the second non-patterning portion 121b.

After the photoresist PR is formed on the first mold film 140, the second photoresist pattern 155 may be formed by a photolithography process. The second photoresist pattern 155 may include an anti-reflective layer to reduce or possibly prevent light from reflecting against an underlying layer during a photolithography process.

Referring to FIGS. 15A and 15B, the first mold film 140 may be etched using the second photoresist pattern 155 as an etching mask. As a result, the first holes 141 may be formed in the first mold film 140.

Since the first holes 141 are formed by removing portions of the first mold film 140 exposed through the third openings 156, the first holes 141 may vertically overlap the first non-patterning portions 121a.

However, because the second non-patterning portions 121b is covered by the second photoresist pattern 155, the second non-patterning portion 121b may be covered by the first mold film 140 after the first holes 141 are formed.

The second photoresist pattern 155 may be removed.

Figure 16:
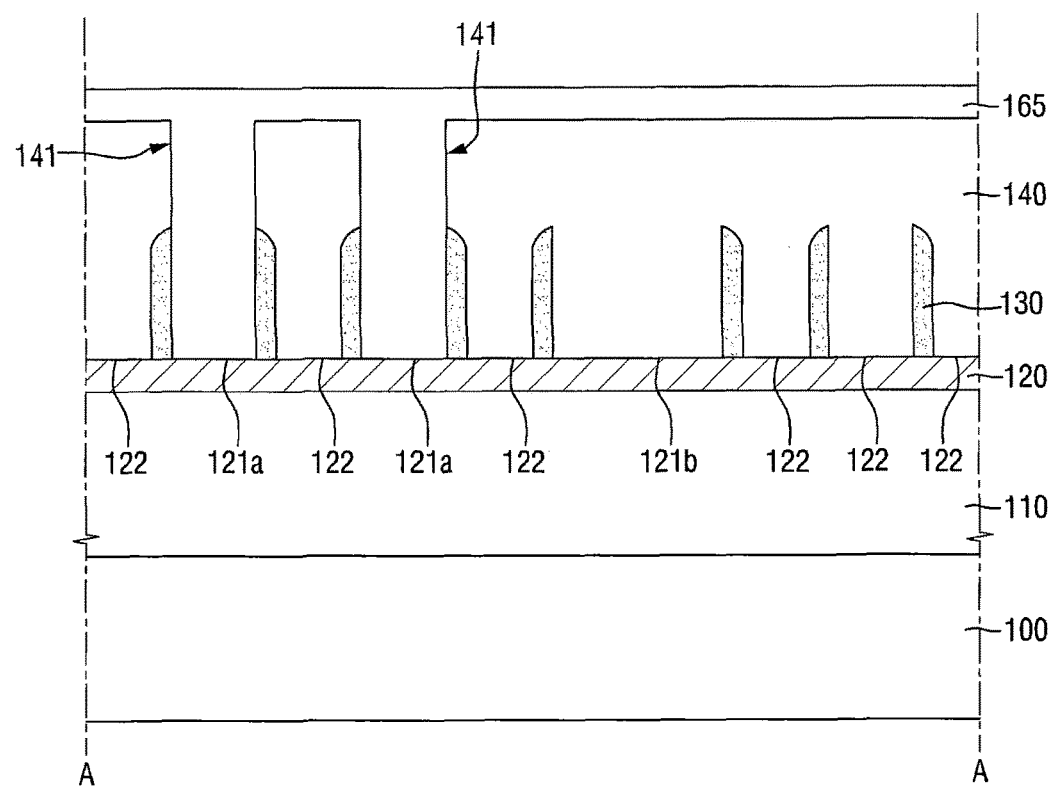
Figure 17:
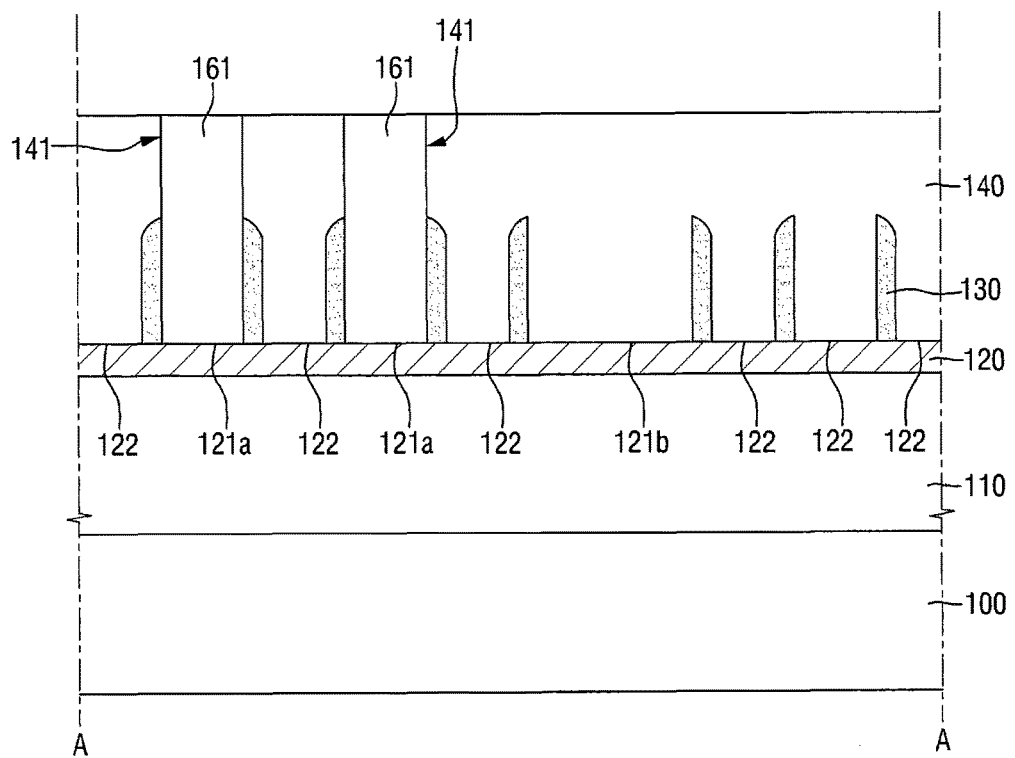

Referring to FIGS. 16 and 17, the second blocking film 165 filling the first holes 141 may be formed on the hard mask film 120.

The second blocking film 165 may cover the upper surface of the first mold film 140. The second blocking film 165 may also cover the upper surface of the first mold film 140 covering the second non-patterning portion 121b.

The second blocking film 165 may include a material having an etch selectivity with respect to the first mold film 140.

The second blocking film 165 may include a material having a good gap-fill ability. For example, the second blocking film 165 may include spin-on hardmask (SOH), flowable CVD (FCVD) oxide, Tonen silazen (TOSZ), and so on, but not limited thereto. In some embodiments, the second blocking film 165 may include silicon oxide formed using an atomic layer deposition (ALD) process.

The first blocking patterns 161 may be formed in the first mold film 140 by removing a portion of the second blocking film 165 formed on the upper surface of the first mold film 140.

The first blocking patterns 161 may be formed on the respective first non-patterning portions 121a and may vertically overlap the respective first non-patterning portions 121a. A blocking pattern vertically overlapping the second non-patterning portion 121b may not be formed on the second non-patterning portion 121b.

Referring to FIGS. 18A and 18B, a third photoresist pattern 170 including a fourth opening 171 may be formed on the first mold film 140.

The fourth opening 171 may vertically overlap the second non-patterning portion 121b.

The third photoresist pattern 170 may cover the patterning portions 122 and the first non-patterning portions 121a. That is, the third photoresist pattern 170 may cover the first blocking patterns 161 vertically overlapping the respective first non-patterning portions 121a.

After the photoresist PR is formed on the first mold film 140, the third photoresist pattern 170 may be formed by a photolithography process. The third photoresist pattern 170 may include an anti-reflective layer to reduce or possibly prevent light from reflecting against underlying layers during a photolithography process.

Figure 19:
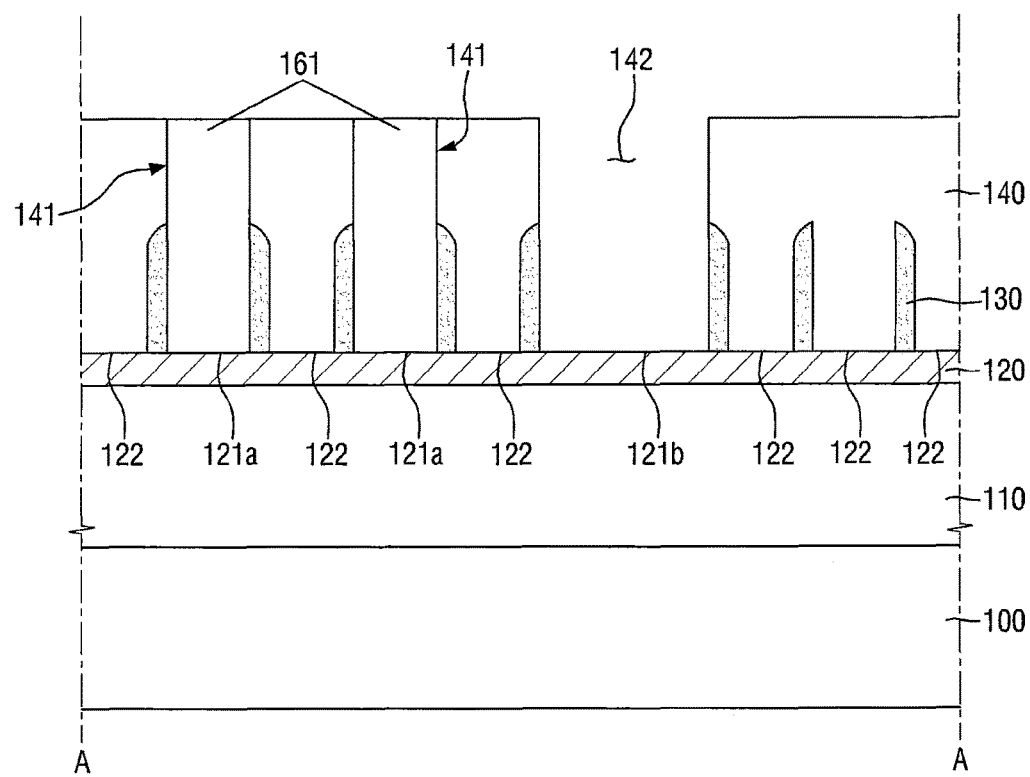

Referring to FIG. 19, the first mold film 140 may be etched using the third photoresist pattern 170 as an etching mask. As a result, the second hole 142 may be formed in the first mold film 140.

Because the second hole 142 is formed by removing a portion of the first mold film 140 exposed through the fourth opening 171, the second hole 142 may vertically overlap the second non-patterning portion 121b.

However, during removal of the portion of the first mold film 140 vertically overlapping the fourth opening 171, the first blocking patterns 161 vertically overlapping the respective first non-patterning portions 121a may be covered by the third photoresist pattern 170.

The third photoresist pattern 170 may be removed after the second hole 142 is formed.

Figure 20:
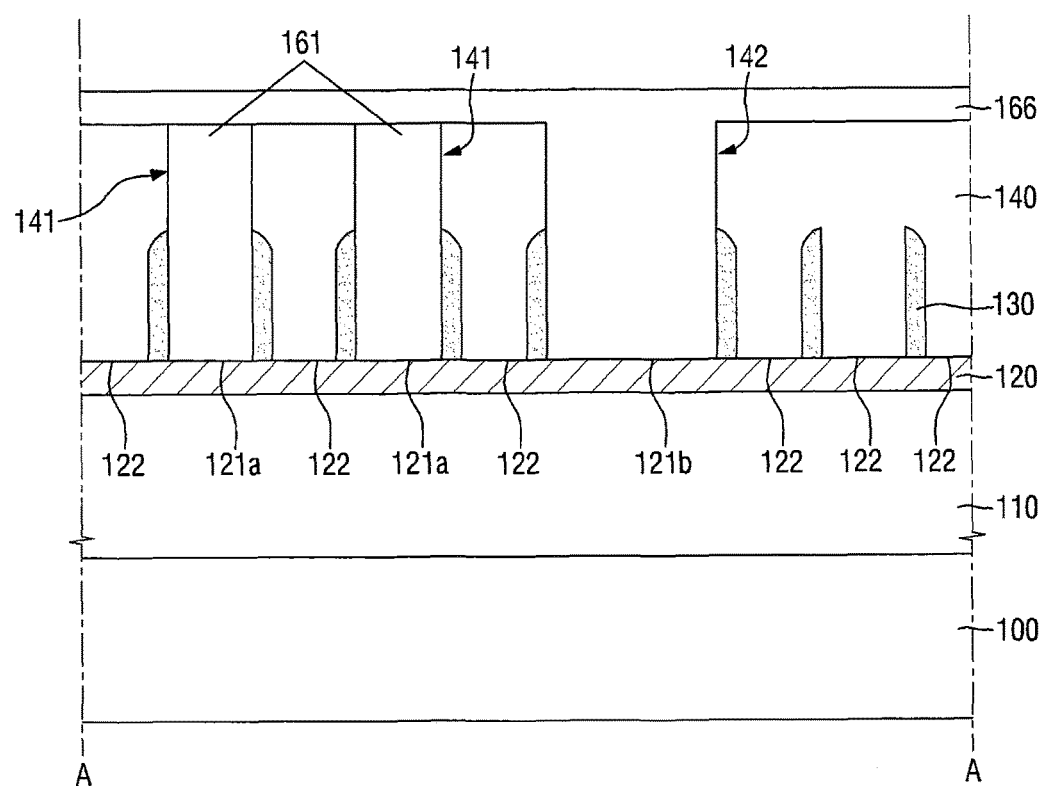

Referring to FIG. 20, the third blocking film 166 filling the second hole 142 may be formed on the hard mask film 120.

The third blocking film 166 may cover the upper surface of the first mold film 140. The third blocking film 166 may also cover the first blocking patterns 161 vertically overlapping the respective first non-patterning portions 121a.

The third blocking film 166 may include a material having an etch selectivity with respect to the first mold film 140. The description about the third blocking film 166 may be substantially similar to the description about the second blocking film 165.

The second blocking pattern 162 may be formed in the first mold film 140 by removing a portion of the third blocking film 166 formed on the upper surface of the first mold film 140.

As a result, the first blocking patterns 161 vertically overlapping the respective first non-patterning portions 121a, and the second blocking pattern 162 vertically overlapping the second non-patterning portion 121b may be formed in the first mold film 140.

In some example embodiments, as described with reference to FIGS. 14A and 20, the first blocking patterns 161 may be formed first, and then the second blocking pattern 162 may be formed. The present inventive concept, however, is not limited thereto.

In some embodiments, the second blocking pattern 162 may be formed first and then the first blocking patterns 161 may be formed. The second blocking pattern 162 may be formed using the third photoresist pattern 170 and then the first blocking patterns 161 may be formed using the second photoresist pattern 155.

Referring again to FIG. 17, a portion of the second blocking film 165 formed on the upper surface of the first mold film 140 may be removed. The present inventive concept, however, is not limited thereto.

In some embodiments, the third photoresist pattern 170 may be formed on the second blocking film 165. A portion of the second blocking film 165 and a portion of the first mold film 140 that vertically overlaps the second non-patterning portions 121b may be etched and removed using the third photoresist pattern 170 as an etching mask. After forming of the third blocking film 166 filling the second hole 142 in the first mold film 140, the second blocking film 165 and the third blocking film 166 remaining on the upper surface of the first mold film 140 may be removed.

Referring again to FIGS. 18A and 18B, the third photoresist pattern 170 may cover the first non-patterning portions 121a, although the present inventive concept is not limited thereto.

The third photoresist pattern 170 may include an opening vertically overlapping the first non-patterning portions 121a. Even when the first blocking patterns 161 vertically overlapping the first non-patterning portions 121a are exposed by the third photoresist pattern 170, the first blocking patterns 161 may not be removed while the second hole 142 is being formed since the first blocking patterns 161 may include a material having an etch selectivity with respect to the first mold film 140.

A method of fabricating a semiconductor device according to some example embodiments of the inventive concept will be described below with reference to FIGS. 1 to 5B, 14A to 17, and 21A to 22.

Figure 21A:
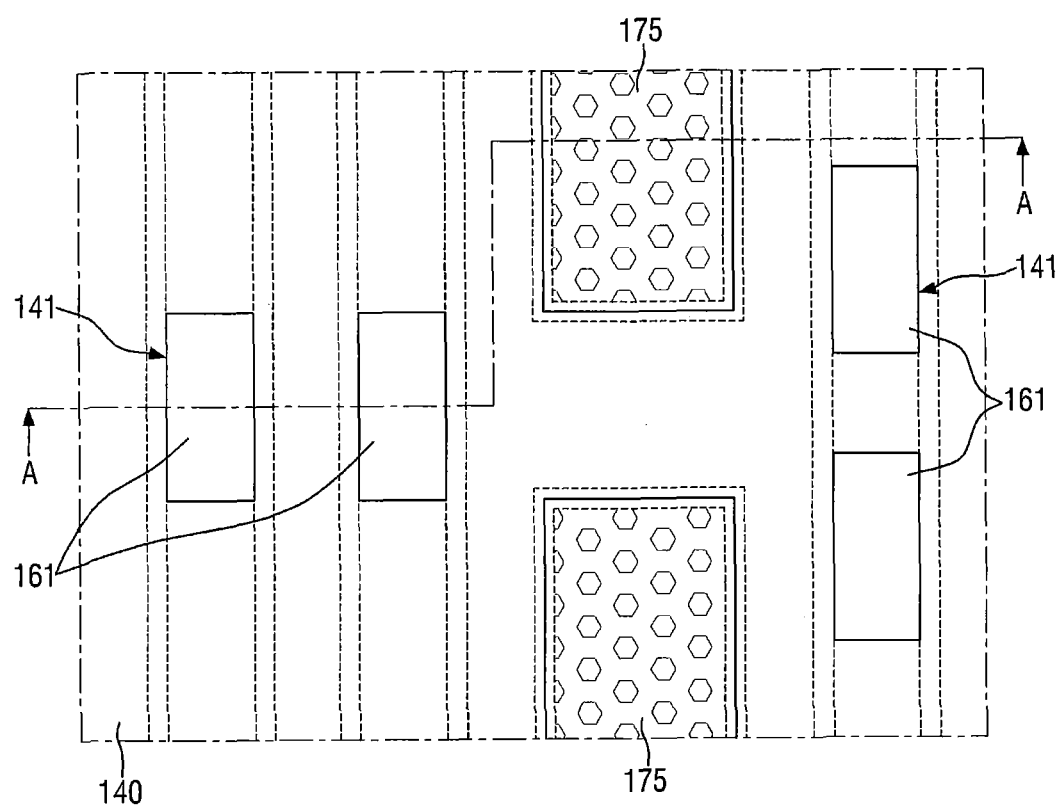
FIGS. 21A to 22 are views illustrating a method of fabricating of a semiconductor device according to some example embodiments of the present inventive concept.
Figure 21B:
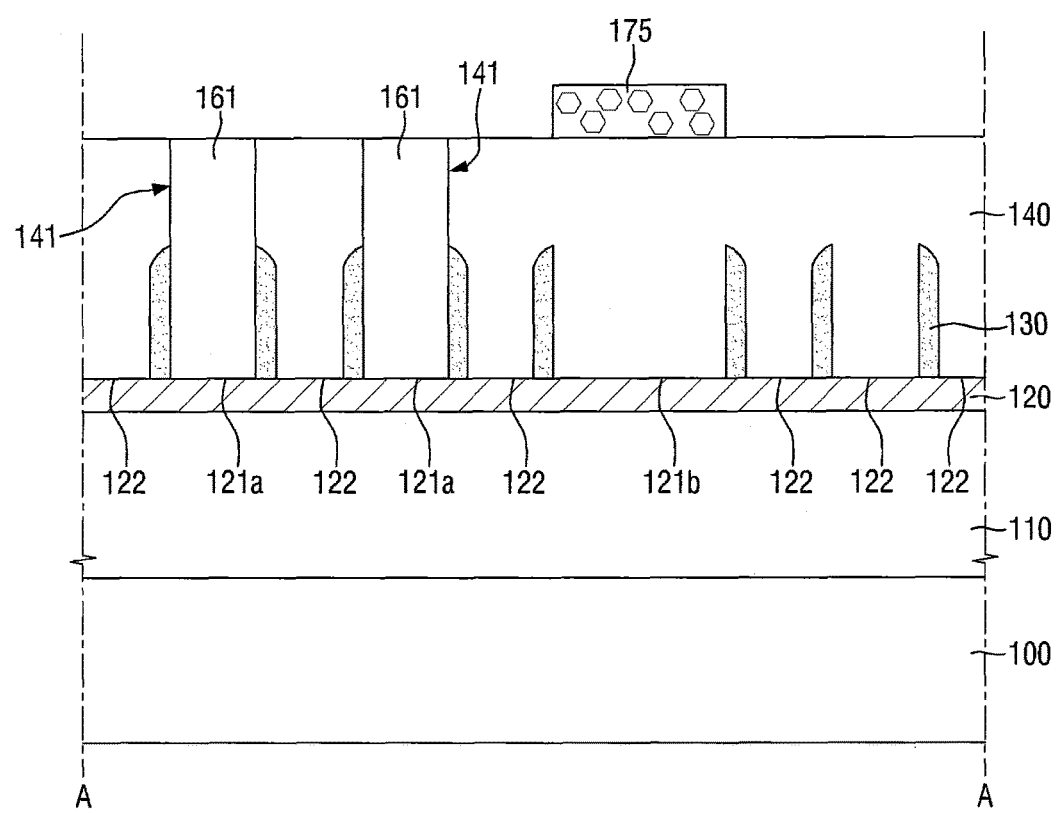
Figure 22:
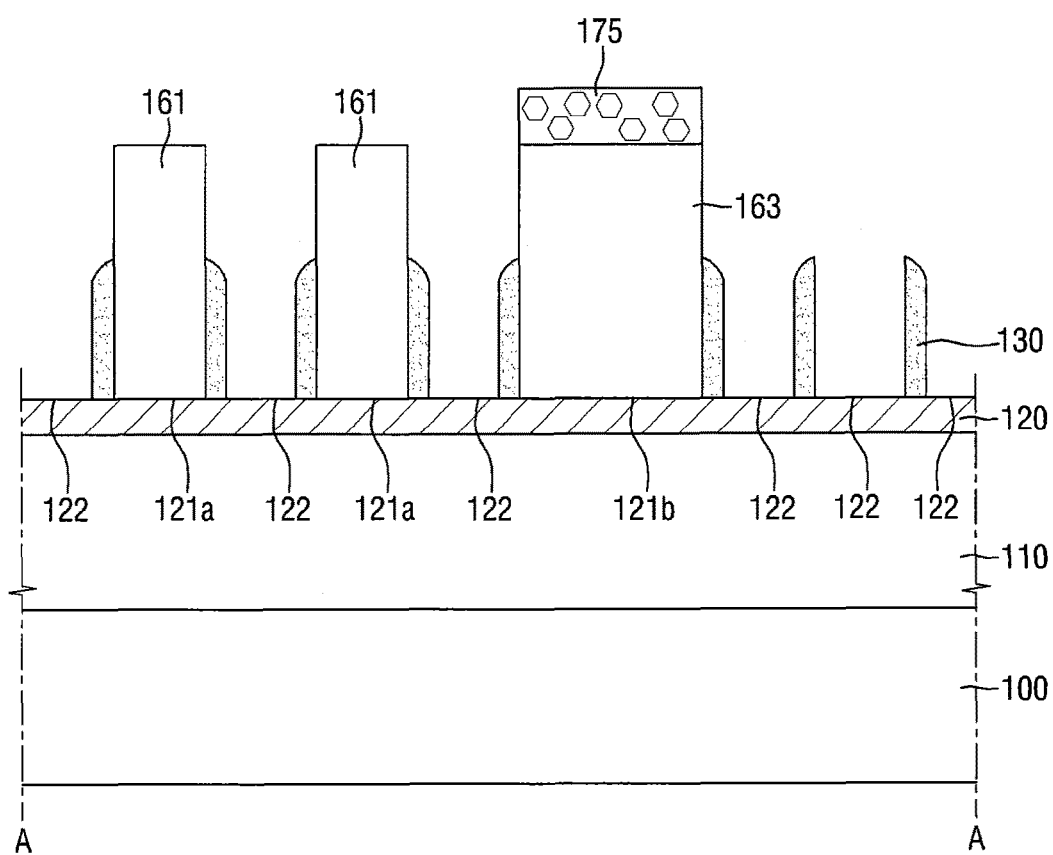

FIGS. 21A to 22 are views illustrating a method of fabricating a semiconductor device according to some example embodiments of the inventive concept.

FIG. 21B is a cross sectional view taken along the line A-A of FIG. 21A. FIGS. 21A and 21B are views illustrating processes which may be performed after FIG. 17.

Referring to FIGS. 21A and 21B, a fourth photoresist pattern 175 may be formed on the first mold film 140 in which the first blocking patterns 161 are formed.

The fourth photoresist pattern 175 may vertically overlap the second non-patterning portion 121b. The first non-patterning portions 121a and the patterning portion 122 may not be covered by the fourth photoresist pattern 175.

Unlike the "contact type" second photoresist pattern 155 in FIG. 14B, the fourth photoresist pattern 175 may be an "island type".

After the photoresist PR is formed on the first mold film 140, the fourth photoresist pattern 175 may be formed by a photolithography process. The fourth photoresist pattern 175 may include an anti-reflective layer to reduce or possibly prevent light from reflecting against an underlying layer during a photolithography process.

Referring to FIG. 22, the first mold film 140 may be patterned using the fourth photoresist pattern 175 as a mask (e.g., etching mask).

Portions of the first mold film 140, which are not covered by the fourth photoresist pattern 175, may be removed using the fourth photoresist pattern 175 as an etching mask. As a result, the third blocking pattern 163 vertically overlapping the second non-patterning portion 121b may be formed on the second non-patterning portion 121b.

Since the first blocking patterns 161 include a material having an etch selectivity with respect to the first mold film 140, the first blocking patterns 161 may not be removed during forming of the third blocking pattern 163.

Since the third blocking pattern 163 is formed by patterning the first mold film 140, the first blocking patterns 161 may include a material having an etch selectivity with respect to the third blocking pattern 163.

The patterning portions 122 of the hard mask film 120 may be etched using the spacers 130, the first blocking patterns 161 and the third blocking pattern 163 as a mask (e.g., etching mask).

A method of fabricating a semiconductor device according to some example embodiments of the inventive concept will be described below with reference to FIGS. 1 to 5B, and 23A to 28.

FIGS. 23A to 28 are views illustrating a method of fabricating a semiconductor device according to some example embodiments of the inventive concept.

Figure 23A:
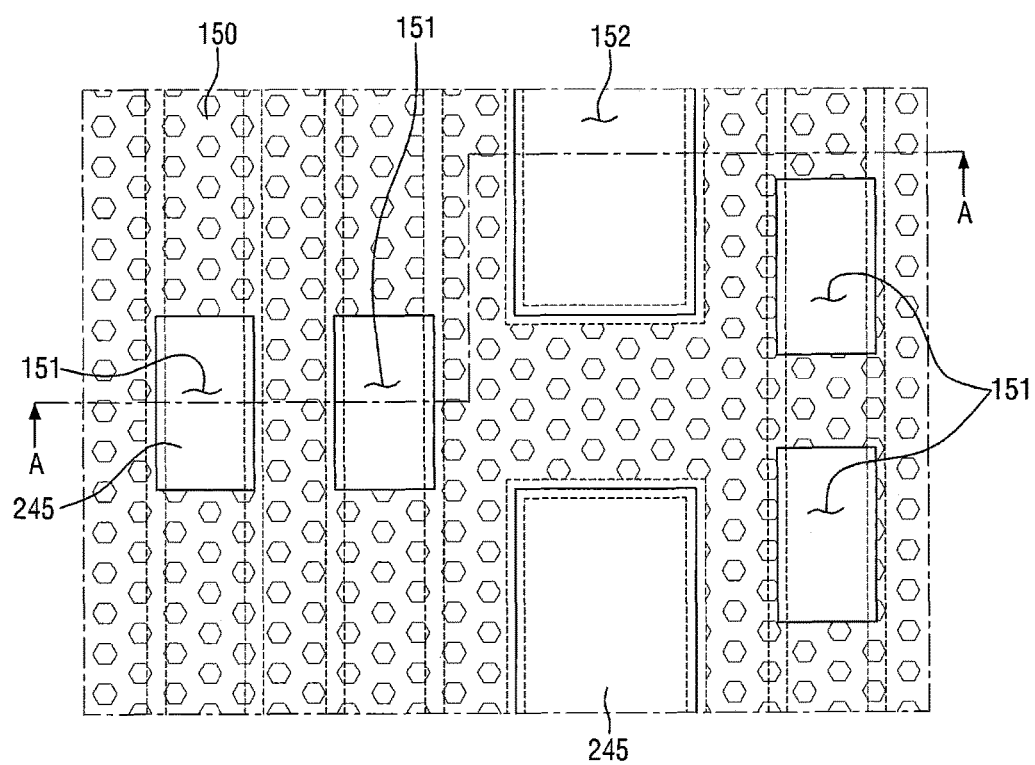
FIGS. 23A to 28 are views illustrating a method of fabricating a semiconductor device according to some example embodiments of the present inventive concept.
Figure 23B:
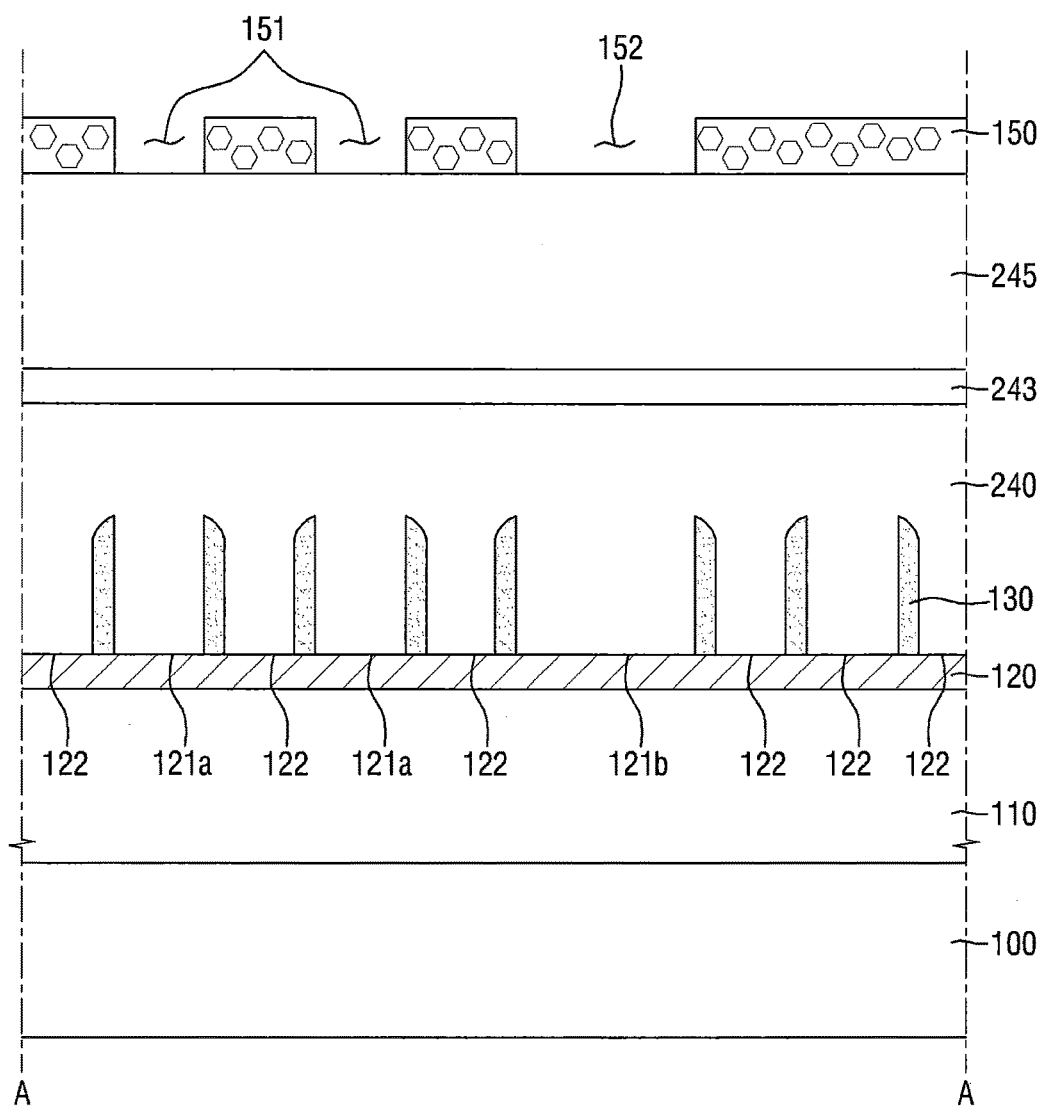

For reference, FIG. 23B is a cross sectional view taken on line A-A of FIG. 23A. Additionally, FIGS. 23A and 23B may be the views of fabricating process which is performed after FIGS. 5A and 5B.

Referring to FIGS. 23A and 23B, on the hard mask film 120 and the spacers 130, a second lower mold film 240, an etch stop film 243 and a second upper mold film 245 may be sequentially formed.

The second lower mold film 240 may cover the spacers 130. The second lower mold film 240 covering the spacers 130 may include a flat upper surface.

The second lower mold film 240 may include, for example, silicon oxide, amorphous silicon, amorphous carbon layer (ACL), spin-on hardmask (SOH), and so on, but not limited thereto.

The etch stop film 243 may be formed on the second lower mold film 240. The etch stop film 243 may include a material having an etch selectivity with respect to the second upper mold film 245.

The etch stop film 243 may include, for example, silicon oxide, silicon oxynitride, silicon nitride, silicon carbonitride (SiCN), amorphous silicon, and so on, but not limited thereto.

The second upper mold film 245 may be formed on the etch stop film 243. The second upper mold film 245 may include, for example, silicon oxide, silicon nitride, amorphous silicon, amorphous carbon layer (ACL), carbon spin-on hardmask (SOH), and so on, but not limited thereto.

The first photoresist pattern 150 may be formed on the second upper mold film 245.

The first photoresist pattern 150 may include the first openings 151 vertically overlapping the first non-patterning portions 121a and the second opening 152 vertically overlapping the second non-patterning portion 121b.

Figure 24:
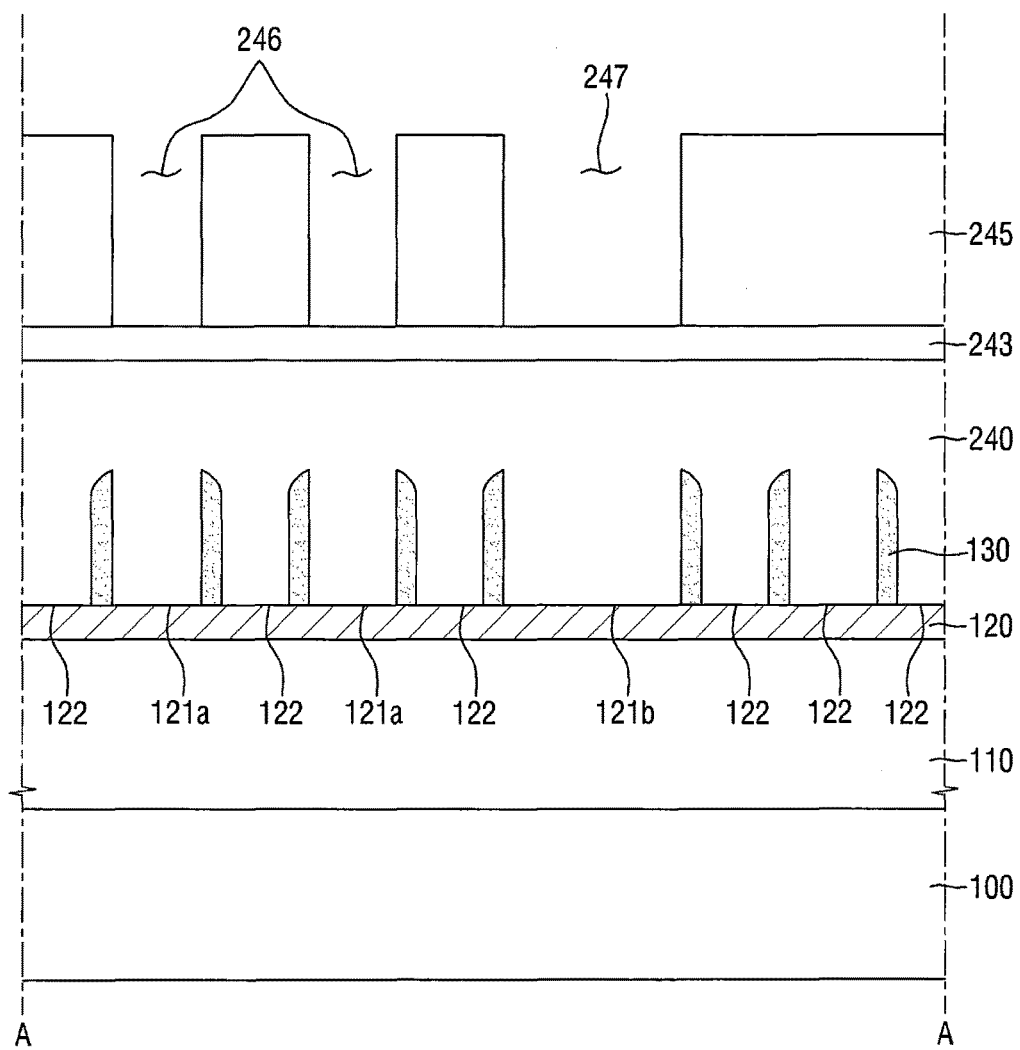

Referring to FIG. 24, the second upper mold film 245 may be etched using the first photoresist pattern 150 as an etching mask. As a result, third holes 246 and a fourth hole 247 may be formed in the second upper mold film 245.

Because the third holes 246 are formed by removing portions of the second upper mold film 245 exposed through the first openings 151, the third holes 246 may vertically overlap the respective first non-patterning portions 121a.

Because the fourth hole 247 is formed by removing a portion of the second upper mold film 245 exposed through the second opening 152, the fourth hole 247 may vertically overlap the second non-patterning portion 121b.

The first photoresist pattern 150 may be removed after the third holes 246 and the fourth hole 247 are formed.

Figure 25:
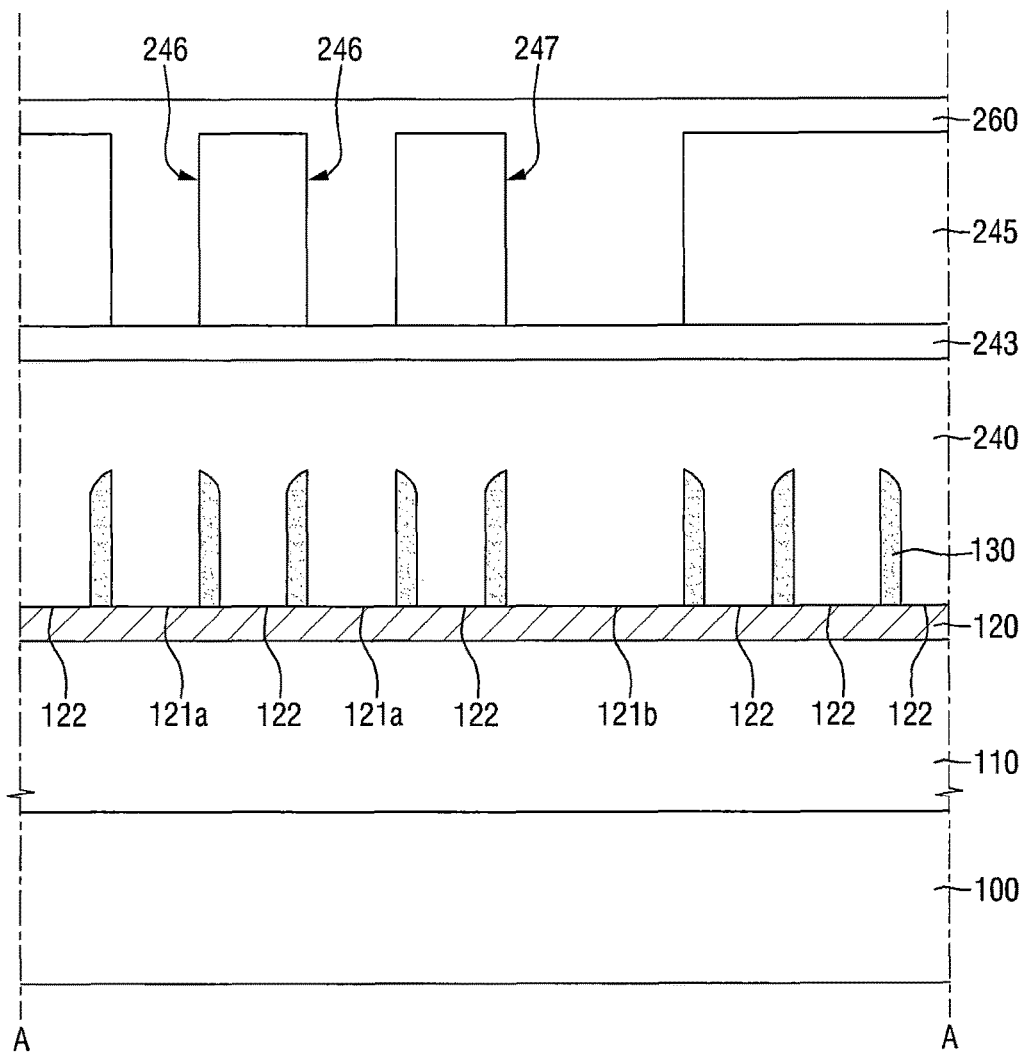

Referring to FIG. 25, the fourth blocking film 260 filling the third holes 246 and the fourth hole 247 may be formed on the etch stop film 243. The fourth blocking film 260 may cover the upper surface of the second upper mold film 245.

The fourth blocking film 260 may include a material having an etch selectivity with respect to the second upper mold film 245.

The fourth blocking film 260 may include a material having a good gap-fill ability. For example, the fourth blocking film 260 may include spin-on hardmask (SOH), flowable CVD (FCVD) oxide, Tonen silazen (TOSZ), and so on, but not limited thereto. In some embodiments, the fourth blocking film 260 may include a silicon oxide formed using an atomic layer deposition (ALD) process.

Figure 26:
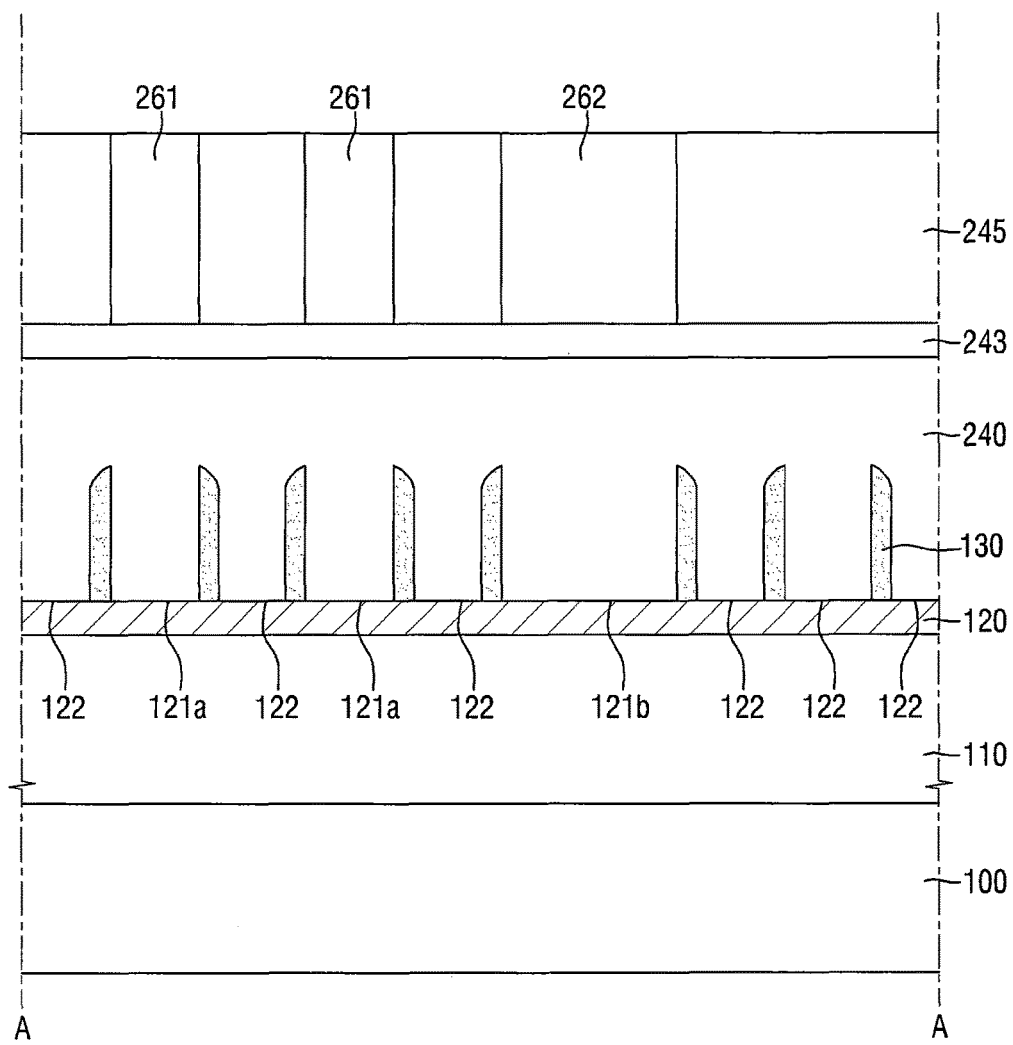

Referring to FIG. 26, fourth upper blocking patterns 261 and a fifth upper blocking pattern 262 may be formed in the second upper mold film 245 by removing a portion of the fourth blocking film 260 formed on the upper surface of the second upper mold film 245.

The fourth upper blocking patterns 261 may vertically overlap the respective first non-patterning portions 121a, and the fifth upper blocking pattern 262 may vertically overlap the second non-patterning portion 121b.

Figure 27:
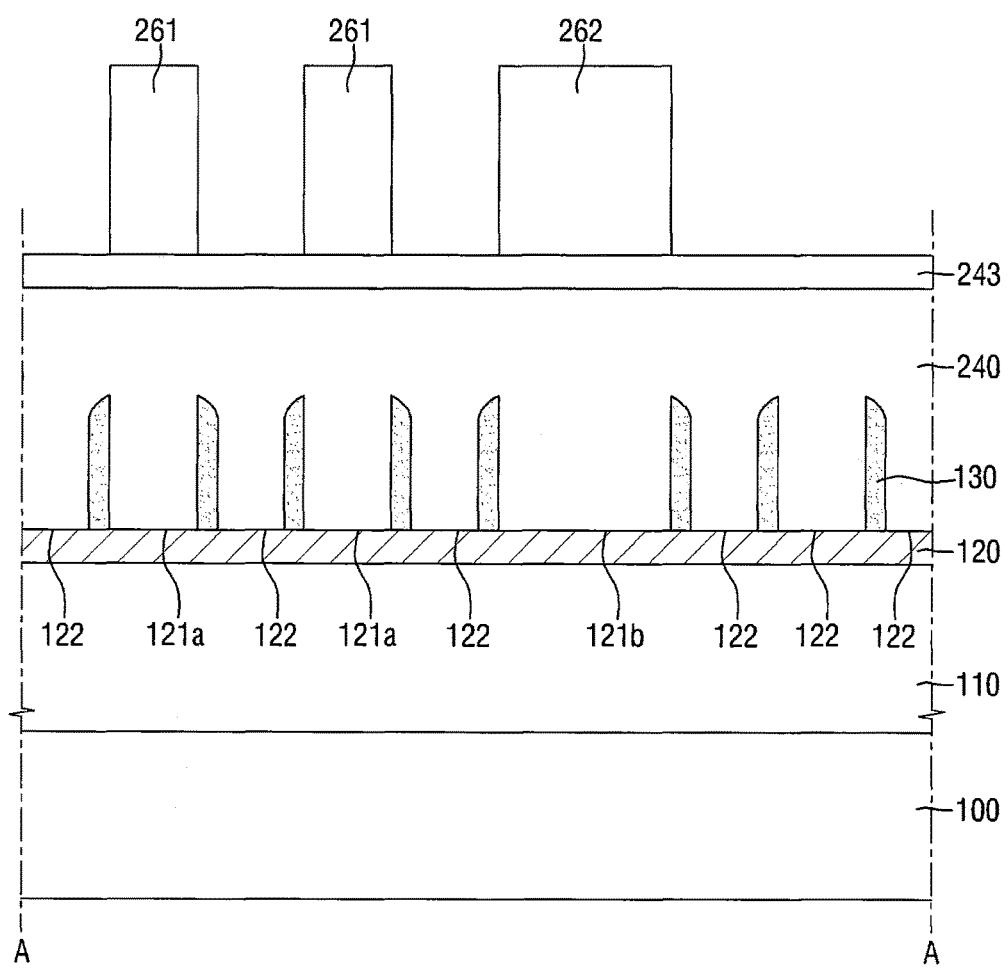

Referring to FIG. 27, the second upper mold film 245 on the etch stop film 243 may be removed.

The fourth upper blocking patterns 261 and the fifth upper blocking pattern 262 on the etch stop film 243 may remain.

The fourth upper blocking patterns 261 and the fifth upper blocking pattern 262 may include a material having an etch selectivity with respect to the second upper mold film 245, and the etch stop film 243 includes a material having an etch selectivity with respect to the second upper mold film 245. Accordingly, the second upper mold film 245 may be removed using a selective etching process. Stated in other words, the second upper mold film 245 may be selectively etched and the fourth upper blocking patterns 261 and the fifth upper blocking pattern 262 may not be removed as illustrated in FIG. 17.

Figure 28:
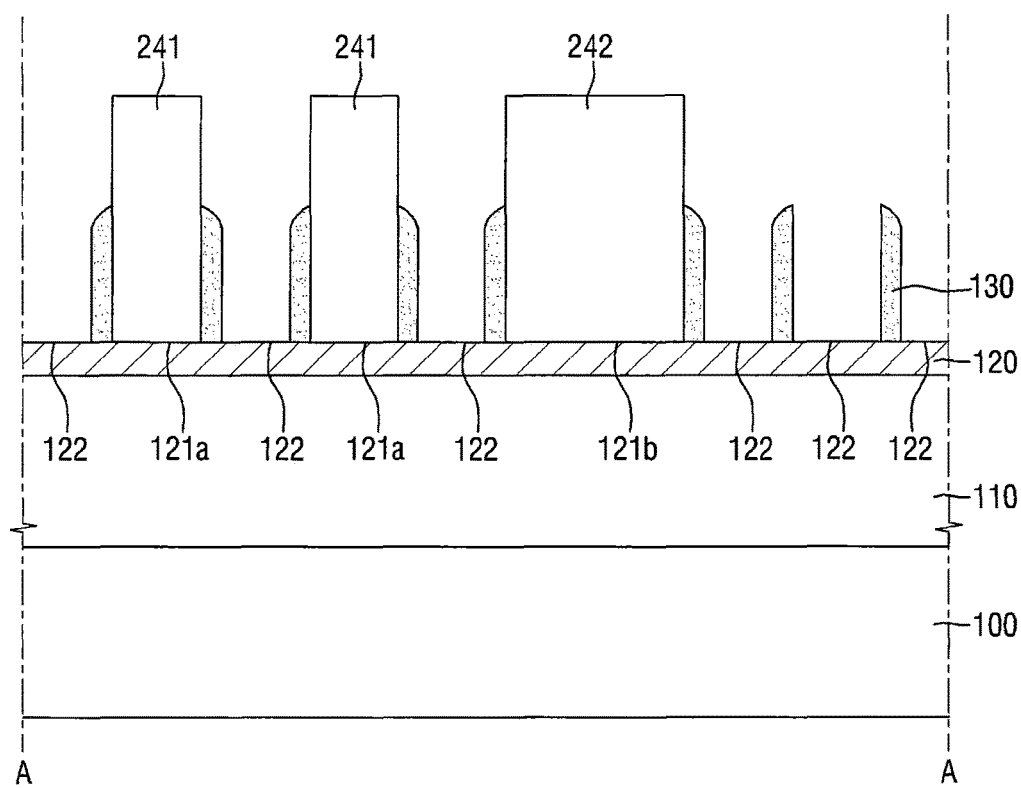

Referring to FIG. 28, a second lower mold film 240 may be patterned using the fourth upper blocking patterns 261 and the fifth upper blocking pattern 262 as a mask (e.g., etching mask).

By patterning the second lower mold film 240, the fourth lower blocking patterns 241 and the fifth lower blocking pattern 242 may be formed on the hard mask film 120.

By patterning the second lower mold film 240 using the fourth upper blocking patterns 261 and the fifth upper blocking pattern 262, the spacers 130 on the hard mask film 120 may be exposed.

In other words, as illustrated in FIGS. 27 and 28, after forming of the fourth upper blocking patterns 261 and the fifth upper blocking pattern 262, the second upper mold film 245 and the second lower mold film 240 vertically overlapping the patterning portions 122 of the hard mask film 120 may be removed.

The hard mask film 120 may be etched using the fourth lower blocking patterns 241, the fifth lower blocking pattern 242 and the spacers 130 as an etching mask. As the patterning portions 122 of the hard mask film 120 are etched, the hard mask pattern 125 may be formed on the lower film 110.

Figure 29:
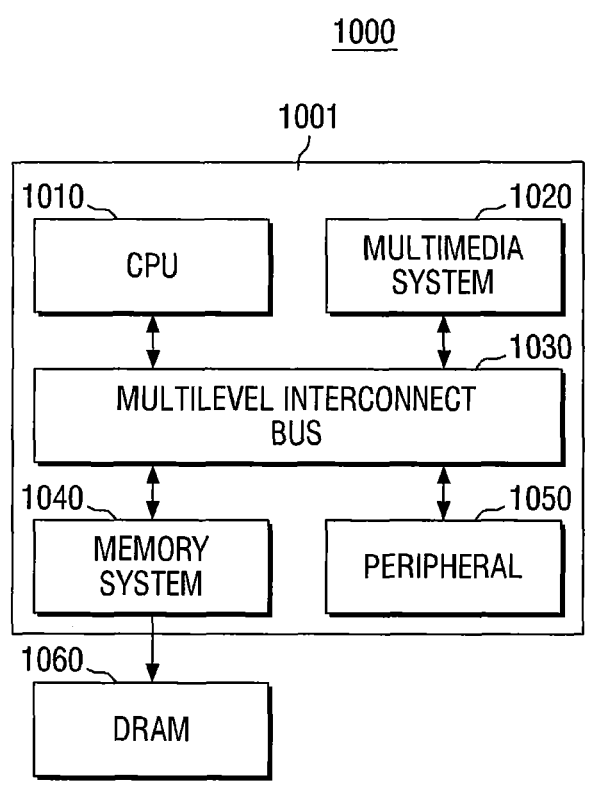
FIG. 29 is a block diagram of a SoC system including a semiconductor device fabricated according to some example embodiments of the present inventive concept.

FIG. 29 is a block diagram of a SoC system including a semiconductor device according to some example embodiments of the inventive concept.

Referring to FIG. 29, the SoC system 1000 may include an application processor 1001 and a DRAM 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for driving of the SoC system 1000. In some example embodiments, the CPU 1010 may be on a multi-core environment which includes a plurality of cores.

The multimedia system 1020 may be used for performing a variety of multimedia functions of the SoC system 1000. The multimedia system 1020 may include a three-dimensional (3D) engine module, a video codec, a display system, a camera system, and/or a post-processor.

The bus 1030 may be used for exchanging data communication among the CPU 1010, the multimedia system 1020, the memory system 1040 and the peripheral circuit 1050. In some example embodiments, the bus 1030 may have a multi-layer structure. Specifically, an example of the bus 1030 may be a multi-layer advanced high-performance bus (AHB), or a multi-layer advanced eXtensible interface (AXI), although the inventive concept is not limited herein.

The memory system 1040 may provide environments necessary for the application processor 1001 to connect to an external memory (e.g., DRAM 1060) and perform high-speed operation. In some example embodiments, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some example embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include at least one of semiconductor devices fabricated using a method according to example embodiments of the inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating a semiconductor device, the method comprising:
   forming a hard mask film on a lower film;
   forming first spacers on the hard mask film, the hard mask film including an exposure region exposed by the first spacers and the exposure region including a patterning portion and a non-patterning portion;
   forming a mold film on the first spacers;
   forming a blocking pattern in the mold film, the blocking pattern vertically overlapping the non-patterning portion of the hard mask film; and after forming the blocking pattern, exposing the first spacers by removing the mold film.

2. The method of claim 1, wherein forming the blocking pattern includes:
forming a hole in the mold film, the hole vertically overlapping the non-patterning portion of the hard mask film;
forming a blocking film filling the hole and extending on an upper surface of the mold film; and
removing a portion of the blocking film extending on the upper surface of the mold film.

3. The method of claim 2, further comprising forming a hard mask pattern on the lower film by etching the patterning portion of the hard mask film using the blocking pattern and the first spacers as an etching mask.

4. The method of claim 1, wherein the mold film includes a lower mold film and an upper mold film sequentially stacked on the hard mask film, and
wherein the blocking pattern is formed in the upper mold film.

5. The method of claim 4, further comprising:
removing the upper mold film after forming the blocking pattern; and
forming a lower blocking pattern by patterning the lower mold film using the blocking pattern as a mask.

6. The method of claim 5, wherein forming the lower blocking pattern includes exposing the first spacers.

7. The method of claim 5, further comprising forming a hard mask pattern on the lower film by etching the patterning portion of the hard mask film using the lower blocking pattern and the first spacers as an etching mask.

8. A method of fabricating a semiconductor device, the method comprising:
forming a hard mask film on a lower film;
forming spacers on the hard mask film, the spacers defining an exposure region of the hard mask film and the exposure region including a patterning portion, a first non-patterning portion and a second non-patterning portion that have different widths;
forming a mold film on the spacers;
forming a first blocking pattern in the mold film, the first blocking pattern vertically overlapping the first non-patterning portion;
forming a second blocking pattern vertically overlapping the second non-patterning portion; and
after forming the first blocking pattern, exposing the spacers by removing the mold film.

9. The method of claim 8, wherein the first blocking pattern and the second blocking pattern are concurrently formed.

10. The method of claim 9, wherein the second blocking pattern is formed in the mold film, and
wherein forming the first blocking pattern and the second blocking pattern includes:
forming a first hole and a second hole in the mold film, the first hole vertically overlapping the first non-patterning portion and the second hole vertically overlapping the second non-patterning portion;
forming a blocking film filling the first hole and the second hole and extending on an upper surface of the mold film; and
removing a portion of the blocking film extending on the upper surface of the mold film.

11. The method of claim 9, further comprising forming a photoresist pattern on the mold film,
wherein the photoresist pattern includes a first opening vertically overlapping the first non-patterning portion and a second opening vertically overlapping the second non-patterning portion.

12. The method of claim 8, wherein the second blocking pattern is formed after the first blocking pattern is formed.

13. The method of claim 12, further comprising:
prior to forming the first blocking pattern, forming a first photoresist pattern on the mold film, the first photoresist pattern including a first opening vertically overlapping the first non-patterning portion; and
after forming the first blocking pattern, forming a second photoresist pattern on the mold film, the second photoresist pattern including a second opening vertically overlapping the second non-patterning portion.

14. The method of claim 8, further comprising forming a hard mask pattern on the lower film by etching the patterning portion of the hard mask film using the first and the second blocking patterns and the spacers as a mask.

15. A method of fabricating a semiconductor device, the method comprising:
forming a mask film on a substrate;
forming a plurality of preliminary masks on the mask film;
forming a mold film on the plurality of preliminary masks, the mold film comprising a first hole that extends between a first pair of the plurality of preliminary masks;
forming a blocking pattern in the first hole of the mold film;
at least partially removing the mold film; and
etching the mask film using the plurality of preliminary masks and the blocking pattern as an etching mask after at least partially removing the mold film.

16. The method of claim 15, wherein the plurality of preliminary masks comprises a second pair of the plurality of preliminary masks,
wherein the mold film comprises a second hole extending between the second pair of the plurality of preliminary masks,
wherein the blocking pattern comprises a first blocking pattern in the first hole and a second blocking pattern in the second hole, and the second blocking pattern has a width greater than a width of the first blocking pattern, and
wherein etching the mask film comprises etching the mask film using the plurality of preliminary masks, the first blocking pattern and the second blocking pattern as an etching mask after at least partially removing the mold film.

17. The method of claim 16, wherein the first blocking pattern and the second blocking pattern are formed concurrently.

18. The method of claim 15, wherein the plurality of preliminary masks comprises a second pair of the plurality of preliminary masks,
wherein at least partially removing the mold film comprises:
forming a mask pattern on the mold film, the mask pattern vertically overlapping a portion of the mold film that extends between the second pair of the plurality of preliminary masks; and
etching the mold film using the mask pattern as an etching mask, and
wherein etching the mask film comprises etching the mask film using the plurality of preliminary masks, the blocking pattern and the portion of the mold film that extends between the second pair of the plurality of preliminary masks as an etching mask after at least partially removing the mold film.

19. The method of claim 15, wherein the plurality of preliminary masks comprises a second pair of the plurality of preliminary masks, wherein at least partially removing the mold film comprises exposing opposing sides of each of the second pair of the plurality of preliminary masks, and wherein etching the mask film comprises etching the mask film using the second pair of the plurality of preliminary masks as an etching mask after at least partially removing the mold film.

20. The method of claim 15, wherein the mold film has an etch selectivity with respect to both the plurality of preliminary masks and the blocking pattern.

* * * * *